(12) United States Patent
Yeh et al.

(10) Patent No.: US 11,688,837 B2
(45) Date of Patent: Jun. 27, 2023

(54) LIGHT-EMITTING DEVICE

(71) Applicant: Everlight Electronics Co., Ltd., New Taipei (TW)

(72) Inventors: Hung-Hsiang Yeh, New Taipei (TW); Robert Yeh, New Taipei (TW); Tsung-Yuan Chen, New Taipei (TW); Bo-Yu Chen, New Taipei (TW)

(73) Assignee: EVERLIGHT ELECTRONICS CO., LTD., New Taipei (TW)

( * ) Notice: Subject to any disclaimer, the term of this patent is extended or adjusted under 35 U.S.C. 154(b) by 86 days.

(21) Appl. No.: 17/101,050

(22) Filed: Nov. 23, 2020

(65) Prior Publication Data

US 2021/0313493 A1 Oct. 7, 2021

Related U.S. Application Data

(60) Provisional application No. 63/006,226, filed on Apr. 7, 2020.

(51) Int. Cl.
| | |
|---|---|
| *H01L 33/58* | (2010.01) |
| *H01L 25/075* | (2006.01) |
| *H01L 33/46* | (2010.01) |
| *H01L 33/50* | (2010.01) |
| *H01L 33/60* | (2010.01) |
| *H01L 33/62* | (2010.01) |

(52) U.S. Cl.
CPC .......... *H01L 33/58* (2013.01); *H01L 25/0753* (2013.01); *H01L 33/46* (2013.01); *H01L 33/505* (2013.01); *H01L 33/60* (2013.01); *H01L 33/62* (2013.01); *H01L 2933/0091* (2013.01)

(58) Field of Classification Search
CPC ....... H01L 33/505; H01L 33/46; H01L 33/58; H01L 33/60; H01L 33/62; H01L 25/0753; H01L 2933/0091
See application file for complete search history.

(56) References Cited

U.S. PATENT DOCUMENTS

| | | | | |
|---|---|---|---|---|
| 2016/0104824 | A1* | 4/2016 | Furuyama | H01L 33/44 257/98 |
| 2018/0351048 | A1* | 12/2018 | Sogai | H01L 33/50 |
| 2019/0386180 | A1* | 12/2019 | Hwang | H01L 33/405 |

* cited by examiner

*Primary Examiner* — Feifei Yeung Lopez

(57) ABSTRACT

A light-emitting device, including a mount substrate, at least one light emitting element, a first light transparent member, a second light transparent member and a covering member, is disclosed. The at least one light emitting element is disposed on the mount substrate in a flip-chip manner. The first light transparent member is configured to receive the incident light emitting from the light emitting element, wherein the first light transparent member is formed of an inorganic substance and an inorganic phosphor, and includes a top surface and a first side surface contiguous to the top surface. The second light transparent member is disposed on the top surface of the first light transparent member and is formed of the inorganic substance and contains no the inorganic phosphor, and includes an externally exposed light emission surface and a second side surface contiguous to the externally exposed light emission surface. The covering member comprises a light reflective material and covers at least the first side surface of the first light transparent member and at least the second side surface of the second light transparent member.

14 Claims, 17 Drawing Sheets

LIGHT-EMITTING DEVICE

CROSS-REFERENCES TO RELATED APPLICATIONS

This application claims priority to U.S. Provisional Patent Application No. 63/006,226, filed on Apr. 7, 2020, which is hereby incorporated by reference in its entirety.

BACKGROUND OF THE INVENTION

Field of the Invention

The present invention relates to a light emitting device, and in particular, relates to a light emitting device including at least one light emitting element, and the light emitting element is arranged in the form of a flip chip.

Descriptions of the Related Art

Light-emitting diodes (LEDs) are becoming more and more popular because of their longer service life and lower power consumption as compared to traditional light emitting devices. LEDs are applied in various fields including electronic billboards, automotive lamps and indoor lighting or the like. At present, most of the LEDs in industrial development are moving towards the goal of high brightness (high concentration) and low light loss (low light leakage). The packaging mode of LEDs is one of the key factors affecting brightness.

However, in the prior art at this stage, in order to pursue luminous efficiency and/or save cost, it is difficult for the LED package to give consideration to the reliability of light emitting devices in different environments. For example, LED includes an LED chip and a fluorescent layer which is disposed on the LED chip. Although, an LED with a top light emission surface of a fluorescent layer that be exposed outside may have lower production cost, but the fluorescent layer will rapidly deteriorate in high temperature, high humidity and sulfur-containing gas environment, and thus will affect the LED emitting effect and color. Alternatively, the fluorescent layer and the reflective wall may be pressed against each other and thus be damaged and peeled off in high temperature environment due to the difference of material expansion coefficients, which leads failure of reliability temperature cycle of LED and affect the quality of LED significantly.

In addition, due to the limitation of the conventional grinding process of the fluorescent layer, the luminous efficiency will be reduced if the fluorescent layer is too thick, and the fluorescent layer will be easily broken and damaged if it is too thin. Therefore, the existing light emitting device cannot further make the fluorescent layer thinner to improve the luminous efficiency.

Accordingly, an urgent need exists in the art to overcome the above problems. It shall be additionally noted that, the above technical content is used to facilitate understanding of the problem to be solved by the present invention, which is not necessarily published or well known in the art.

SUMMARY OF THE INVENTION

An object of the present invention is to provide a light emitting device which can improve the reliability in different environments, the luminous efficiency and/or reduce the damage rate when the temperature changes. In detail, it can improve at least one of the following problems:

1. Improving the light emitting device which uses phosphor in glass to avoid the excessive thickness of phosphor in glass affects the light-emitting efficiency.
2. Improving the light emitting device which uses the phosphor in glass to avoid exposing the phosphor in glass to the outside, and the phosphor of the phosphor in glass is easily affected by moisture when exposed to the outside.
3. Improving the light emitting device which uses phosphor in glass to avoid the problems like the expansion of white wall/reflective wall/covering member causes the phosphor in glass to be squeezed, and thus be damaged or peeled off. Such problems are caused by the difference of thermal expansion coefficients exists between the phosphor in glass and white glue/reflective wall/covering member.

In order to achieve the aforesaid objective, a light emitting device provided according to the present invention may include a mount substrate, at least one light emitting element, a first light transparent member, a second light transparent member and a covering member. At least one light emitting element is disposed on the mount substrate in a flip-chip manner. The at least one light emitting element comprises a light-transmitting element substrate, a n-type semiconductor layer, a light emitting layer, a p-type semiconductor layer, a first n-electrode, a first p-electrode, a first insulating layer, a second n-electrode and a second p-electrode. The n-type semiconductor layer is disposed on the light-transmitting element substrate. The light emitting layer is disposed on the n-type semiconductor layer. The p-type semiconductor layer is disposed on the light emitting layer. The light emitting layer and the p-type semiconductor layer expose an area of the n-type semiconductor layer. The first n-electrode is disposed on the area of the n-type semiconductor layer. The first p-electrode is disposed on the p-type semiconductor layer. The first insulating layer is disposed on the light-transmitting element substrate so as to insulate the first n-electrode and the first p-electrode from each other. The second n-electrode is disposed on the first n-electrode and the first insulating layer, wherein the second n-electrode has a first area larger than a first joined face between the n-type semiconductor layer and the first n-electrode so that the second n-electrode is electrically connected to the first n-electrode, wherein the second n-electrode is insulated from the first p-electrode by the first insulating layer. The second p-electrode is disposed on the first p-electrode and the first insulating layer, wherein the second p-electrode has a second area smaller than a third area of the light emitting layer, wherein the second p-electrode is electrically connected to the first p-electrode, wherein the second n-electrode and the second p-electrode have virtually same size and are electrically connected and fixed to the mount substrate. The first light transparent member is configured to receive incident light emitted from the light emitting element, wherein the first light transparent member is formed of an inorganic substance and an inorganic phosphor, and the first light transparent member has a top surface and a first side surface contiguous to the top surface. The second light transparent member is disposed on the top surface of the first light transparent member, wherein the second light transparent member is only formed of the inorganic substance and contains no inorganic phosphor, and the second light transparent member has an externally exposed light emission surface and a second side surface contiguous to the externally exposed light emission surface. The covering member comprises a light reflective material, and covers at least the first side surface of the first light transparent member and at least the second side surface of the second light transparent member.

In an embodiment, in the light emitting device provided according to the present invention, the light emitting element is enclosed by the first light transparent member or the second light transparent member in a plan view from an externally exposed light emission surface side.

In an embodiment, in the light emitting device provided according to the present invention, the light emitting element is not enclosed by the first light transparent member or the second light transparent member in a plan view from an externally exposed light emission surface side, wherein the first side surface of the first light transparent member and the second side surface of the second light transparent member are located inside a top surface of the light emitting element.

In an embodiment, in the light emitting device provided according to the present invention, the first insulating layer has at least one first opening and at least one second opening, and the second n-electrode is electrically connected to the first n-electrode through the at least one first opening of the first insulating layer, and the second p-electrode is electrically connected to the first p-electrode through the at least one second opening of the first insulating layer.

In an embodiment, the light emitting device provided according to the present invention further comprises a conductive layer and a second insulating layer. The conductive layer is disposed on the first insulating layer on the p-type semiconductor layer and have a fourth area that is smaller than the third area of the light emitting layer and is larger than the second area on the second p-electrode, and the conductive layer is electrically connected to the first p-electrode through at least one second opening. The second insulating layer is disposed between the conductive layer and the second n-electrode so as to insulate the conductive layer and the second n-electrode from each other. The second p-electrode is disposed on the conductive layer, the second p-electrode has the second area that is smaller than a second joined face between the p-type semiconductor layer and the first p-electrode, and the second p-electrode is electrically connected to the first p-electrode through the conductive layer.

In an embodiment, in the light emitting device provided according to the present invention, the first insulating layer is a distributed Bragg reflector (DBR) comprising a plurality of first dielectric layers and a plurality of second dielectric layers, wherein the refractive index of the first dielectric layers is different from the refractive index of the second dielectric layers.

In an embodiment, in the light emitting device provided according to the present invention, the first light transparent member comprises quantum dot phosphor and/or non-quantum dot phosphor.

In an embodiment, in the light emitting device provided according to the present invention, the second light transparent member is formed on the first light transparent member by sintering, spray coating, screen printing, sputtering or evaporating method.

To achieve the aforesaid objective, a light emitting device provided according to the present invention may comprise a mount substrate, at least one light emitting element, a first light transparent member, a third light transparent member and a covering member. The at least one light emitting element is disposed on the mount substrate in a flip-chip manner. The at least one light emitting element comprises a light-transmitting element substrate, a n-type semiconductor layer, a light emitting layer, a p-type semiconductor layer, a first n-electrode, a first p-electrode, a first insulating layer, a second n-electrode and a second p-electrode. The n-type semiconductor layer is disposed on the light-transmitting element substrate. The light emitting layer is disposed on the n-type semiconductor layer. The p-type semiconductor layer is disposed on the light emitting layer. The light emitting layer and the p-type semiconductor layer expose an area of the n-type semiconductor layer. The first n-electrode is disposed on the area of the n-type semiconductor layer. The first p-electrode is disposed on the p-type semiconductor layer. The first insulating layer is disposed on the light-transmitting element substrate so as to insulate the first n-electrode and the first p-electrode from each other. The second n-electrode is disposed on the first n-electrode and the first insulating layer, wherein the second n-electrode has a first area larger than a first joined face between the n-type semiconductor layer and the first n-electrode so that the second n-electrode is electrically connected to the first n-electrode, wherein the second n-electrode is insulated from the first p-electrode by the first insulating layer. The second p-electrode is disposed the first p-electrode and the first insulating layer, wherein the second p-electrode has a second area smaller than a third area of the light emitting layer, wherein the second p-electrode is electrically connected to the first p-electrode, wherein the second n-electrode and the second p-electrode have virtually same size and are electrically connected and fixed to the mount substrate. The first light transparent member is configured to receive incident light emitted from the light emitting element, wherein the first light transparent member is formed of an inorganic substance and an inorganic phosphor, and the first light transparent member has a top surface and a first side surface contiguous to the top surface. The third light transparent member is disposed on the top surface of the first light transparent member, wherein the third light transparent member is only formed of the organic substance and contains no phosphor, and has an externally exposed light emission surface and a third side surface contiguous to the light emission surface. The covering member comprises a light reflective material, and covers at least the first side surface of the first light transparent member.

In an embodiment, in the light emitting device provided according to the present invention, the third light transparent member is further disposed on the covering member.

In an embodiment, in the light emitting device provided according to the present invention, the third side surface of the third light transparent member is substantially coplanar with an outermost side surface of the covering member.

In an embodiment, in the light emitting device provided according to the present invention, the third side surface of the third light transparent member is located inside an outermost side surface of the covering member.

In an embodiment, in the light emitting device provided according to the present invention, the third light transparent member further comprises a light diffusion agent.

In an embodiment, in the light emitting device provided according to the present invention, the light emitting element is enclosed by the third light transparent member in a plan view from the externally exposed light emission surface side.

In an embodiment, in the light emitting device provided according to the present invention, the covering member further covers at least a part of the third side surface of the third light transparent member.

In an embodiment, in the light emitting device provided according to the present invention, the covering member includes, on an externally exposed light emission surface side of the light emitting device, an externally exposed surface substantially coplanar with the externally exposed light emission surface.

To achieve the aforesaid objective, a light emitting device provided according to the present invention may comprise a mount substrate, at least one light emitting element, a first light transparent member, a second light transparent member, a covering member and at least one gap. The at least one light emitting element is disposed on the mount substrate in a flip-chip manner. The at least one light emitting element comprises a light-transmitting element substrate, a n-type semiconductor layer, a light emitting layer, a p-type semiconductor layer, a first n-electrode, a first p-electrode, a first insulating layer, a second n-electrode and a second p-electrode. The n-type semiconductor layer is disposed on the light-transmitting element substrate. The light emitting layer is disposed on the n-type semiconductor layer. The p-type semiconductor layer is disposed on the light emitting layer. The light emitting layer and the p-type semiconductor layer expose an area of the n-type semiconductor layer. The first n-electrode is disposed on the area of the n-type semiconductor layer. The first p-electrode is disposed on the p-type semiconductor layer. The first insulating layer is disposed on the light-transmitting element substrate so as to insulate the first n-electrode and the first p-electrode from each other. The second n-electrode is disposed on the first n-electrode and the first insulating layer, wherein the second n-electrode has a first area larger than a first joined face between the n-type semiconductor layer and the first n-electrode so that the second n-electrode is electrically connected to the first n-electrode, wherein the second n-electrode is insulated from the first p-electrode by the first insulating layer. The second p-electrode is disposed on the first p-electrode and the first insulating layer, wherein the second p-electrode has a second area smaller than a third area of the light emitting layer, wherein the second p-electrode is electrically connected to the first p-electrode, wherein the second n-electrode and the second p-electrode have virtually same size and are electrically connected and fixed to the mount substrate. The first light transparent member is configured to receive incident light emitted from the light emitting element, wherein the first light transparent member is formed of an inorganic substance and an inorganic phosphor, and the first light transparent member has a top surface and a side surface contiguous to the top surface. The second light transparent member is disposed on the top surface of the first light transparent member, wherein the second light transparent member is only formed of the inorganic substance and contains no inorganic phosphor, and the second light transparent member has an externally exposed light emission surface and a second side surface contiguous to the light emission surface. The covering member comprises a light reflective material, and covers at least the first side surface of the first light transparent member and the second side surface of the second light transparent member. The at least one gap is disposed between the first side surface of the first light transparent member, the second side surface of the second light transparent member and the covering member.

In an embodiment, in the light emitting device provided according to the present invention, a plurality of second openings of the first insulating layer are formed to be substantially uniformly dispersed.

In an embodiment, in the light emitting device provided according to the present invention, an outermost side surface of the covering element is coplanar with an outermost side surface of the mount substrate.

In an embodiment, in the light emitting device provided according to the present invention, the covering member surrounds the light emitting device.

In an embodiment, in the light emitting device provided according to the present invention, the first light transparent member and the second light transparent member are plate-shaped and the first light transparent member has a light-receiving surface, wherein the light-transmitting element substrate of the light emitting element is connected to the light-receiving surface of the first light transparent member.

In an embodiment, in the light emitting device provided according to the present invention, the covering member covers the light emitting element.

In an embodiment, in the light emitting device provided according to the present invention, at least one light emitting element optically connects with one or more first light transparent members.

In an embodiment, in the light emitting device provided according to the present invention, at least one light emitting element includes a plurality of light emitting elements, wherein the covering member surrounds the plurality of light emitting elements, and the first light transparent member further comprises a light-receiving surface opposite to the light-emitting surface, wherein the plurality of light emitting elements are connected with the light-receiving surface of the first light transparent member, and the light from each light emitting element is incident on the light-receiving surface.

In an embodiment, in the light emitting device provided according to the present invention, each light emitting element is arranged on a mount substrate in a flip-chip manner.

In an embodiment, in the light emitting device provided according to the present invention, each light emitting element is separated from the covering member by a hollow portion.

In an embodiment, in the light emitting device provided according to the present invention, a plurality of joined areas and a covering area are arranged on the light-receiving surface side of the first light transparent member, wherein the plurality of light emitting elements are connected with the plurality of joined areas, and the covering area is covered by the covering member.

In an embodiment, in the light emitting device provided according to the present invention, the light emitting elements are separated from each other, and a separation area is located on the receiving surface side of the first light transparent member between the plurality of joined areas, wherein the separation area is covered by the covering member.

In an embodiment, in the light emitting device provided according to the present invention, the first light transparent member or the second light transparent member comprises a protruding area, which protrudes outward relative to the light emitting element, wherein the covering area is arranged in the protruding area of the light-receiving surface.

In an embodiment, in the light emitting device provided according to the present invention, the covering member comprises at least one oxide, the covering member comprises at least one oxide in a transparent resin, the at least one oxide comprises elements selected from the group consisting of titanium (Ti), zirconium (Zr), niobium (Nb), and aluminum (Al), and titanium (Ti), zirconium (Zr), niobium (Nb), and aluminum (Al) are used as light reflective materials.

In an embodiment, in the light emitting device provided according to the present invention, the first light transparent member comprises a phosphor, which may convert the wavelength of at least a part of light emitted by the light emitting element, wherein the first light transparent member is a sintered material of the phosphor and an inorganic substance.

In an embodiment, in the light emitting device provided according to the present invention, the inorganic substance is alumina ($Al_2O_3$) or glass, and the phosphor is YAG ($Y_3Al_5O_{12}:Ce^{3+}$).

In an embodiment, in the light emitting device provided according to the present invention, at least one light emitting element is separated from the covering member by a hollow portion or a gap.

In an embodiment, in the light emitting device provided according to the present invention, the second light-transmitting element comprises a glass plate.

In an embodiment, in the light emitting device provided according to the present invention, at least one light emitting element and the first light transparent member are fixed to each other by an adhesive material.

In an embodiment, in the light emitting device provided according to the present invention, an adhesive material is inserted at a boundary between at least one light emitting element and a first light transparent member, and the adhesive material is a wavelength conversion member.

In an embodiment, in the light emitting device provided according to the present invention, the adhesive material contains nitride phosphor, which may emit yellow or red light.

In an embodiment, in the light emitting device provided according to the present invention, at least one light emitting element and the first light transparent member are fixed to each other by a crystal adhesion.

In an embodiment, in the light emitting device provided according to the present invention, the light-transmitting element substrate comprises sapphire.

In an embodiment, the light emitting device provided according to the present invention further comprises a lens.

In an embodiment, in the light emitting device provided according to the present invention, the second p-electrode has a second area that is smaller than a second joined face between the first p-electrode and the p-type semiconductor layer.

In an embodiment, in the light emitting device provided according to the present invention, the second p-electrode has a second area that is larger than a third joined face between the first p-electrode and the conductive layer.

In an embodiment, in the light emitting device provided according to the present invention, the first joined face between the first n-electrode and the n-type semiconductor layer is larger than a third joined face between the first p-electrode and the conductive layer.

In an embodiment, in the light emitting device provided according to the present invention, the second joined face between first p-electrode and the p-type semiconductor layer is larger than a third joined face between the first p-electrode and the conductive layer.

In an embodiment, in the light emitting device provided according to the present invention, the second n-electrode has a first area that is larger than a third joined face between the first p-electrode and the conductive layer.

In an embodiment, in the light emitting device provided according to the present invention, the second n-electrode has a first area smaller than the third area of the light emitting layer.

In an embodiment, in the light emitting device provided according to the present invention, the second n-electrode has a first area smaller than the second joined face between the first p-electrode and the p-type semiconductor layer.

In an embodiment, in the light emitting device provided according to the present invention, a fourth joined face between the second p-electrode and the conductive layer is smaller than a second joined face between the first p-electrode and the p-type semiconductor layer.

In an embodiment, in the light emitting device provided according to the present invention, a fourth joined face between the second p-electrode and the conductive layer is smaller than the third area of the light-emitting layer.

In an embodiment, in the light emitting device provided according to the present invention, a fourth joined face between the second p-electrode and the conductive layer is larger than a third joined face between the first p-electrode and the conductive layer.

In an embodiment, in the light emitting device provided according to the present invention, a fifth joined face between the second n-electrode and the first n-electrode is smaller than the first joined face between the first n-electrode and the n-type semiconductor layer.

In an embodiment, in the light emitting device provided according to the present invention, a fifth joined face between the second n-electrode and the first n-electrode is smaller than the third area of the light emitting layer.

In an embodiment, in the light emitting device provided according to the present invention, a fifth joined face between the second n-electrode and the first n-electrode is smaller than the second joined face between the first p-electrode and the p-type semiconductor layer.

In an embodiment, in the light emitting device provided according to the present invention, a fifth joined face between the second n-electrode and the first n-electrode is smaller than the third joined face between the first p-electrode and the conductive layer. In an embodiment, in the light emitting device provided according to the present invention, a fifth joined face between the second n-electrode and the first n-electrode is smaller than the fourth joined face between the second p-electrode and the conductive layer.

In an embodiment, in the light emitting device provided according to the present invention, the phosphor is LuAG ($Lu_3Al_5O_{12}:Ce^{3+}$).

In an embodiment, in the light emitting device provided according to the present invention, the phosphor is Silicate (($Ba,Sr)_2SiO_4:Eu^{2+}$).

In an embodiment, in the light emitting device provided according to the present invention, the phosphor is β-SiAlON ($Si_{6-z}Al_zO_zN_{8-z}:Eu^{2+}$).

In an embodiment, in the light emitting device provided according to the present invention, the phosphor is KSF ($K_2SiF_6:Mn^{4+}$).

To achieve the above objective, the present invention further provides a method for manufacturing a light emitting device, and the method comprises the following steps. The first step is to mount a light emitting element on a mount substrate, so that the light emitting device and the mount substrate are electrically connected with each other. The second step is to optically connect a light emitting side of at least a part of the light emitting element opposite to the mounting side to the first light transparent member and the second light transparent member. The third step is to cover or surround the first light transparent member and the second light transparent member along a thickness direction by a covering member, and the covering member is arranged so that its outer surface extends along the outer surface of the first light transparent member and the second light transparent member.

In an embodiment, in the light emitting device provided according to the present invention, the first n-electrode and the first p-electrode are Indium Tin Oxide (ITO) and Indium Zinc Oxide (IZO). The electrodes are preferably an oxide containing at least one element selected from the group consisting of Zn, In and Sn. Particularly, it is desirable to form a transparent conductive layer containing oxides of Zn, In and Sn, such as ITO, ZnO, $In_2O_3$ and $SnO_2$, and it is ideal to use ITO.

In an embodiment, in the light emitting device provided according to the present invention, the light emitting element comprises Rhodium.

In an embodiment, in the light emitting device provided according to the present invention, the covering member covers the light emitting element.

In an embodiment, in the first light-transmitting element of the light emitting device provided according to the present invention, a concentration of the inorganic phosphor in the inorganic substance increases from the top surface of the first light-transmitting element to the light emitting element, or the concentration of the inorganic phosphor in the inorganic substance increases from the light emitting element to the top surface of the first light-transmitting element.

In an embodiment, in the light emitting device provided according to the present invention, the first light transparent member and the second light transparent member comprises glass or ceramic.

In an embodiment, in the light emitting device provided according to the present invention, the covering member surrounds or covers the light emitting element.

In an embodiment, in the light emitting device provided according to the present invention, the first light-transmitting element and the third light-transmitting element are plate-shaped, and the first light-transmitting element has a light-receiving surface opposite to the top surface of the first light-transmitting element, and the light-transmitting element substrate of the light emitting element is connected to the light-receiving surface of the first light-transmitting element.

In an embodiment, in the light emitting device provided according to the present invention, an inorganic phosphor may convert the wavelength of at least a part of light emitted by the light emitting element, wherein the first light transparent member is a sintered material of inorganic substance and inorganic phosphor.

In an embodiment, in the light emitting device provided according to the present invention, the phosphor comprises quantum dot phosphor and/or non-quantum dot phosphor.

In an embodiment, in the light emitting device provided according to the present invention, the first light transparent member comprises glass or ceramic.

In an embodiment, in the light emitting device provided according to the present invention, the third light transparent member is formed on the first light transparent member by spray coating, screen printing, dispensing or molding.

To achieve the aforesaid objective, a light emitting device provided according to the present invention may comprise a mount substrate, at least one light emitting element, a first light transparent member, a third light transparent member, a covering member and at least one gap. The at least one light emitting element is disposed on the mount substrate in a flip-chip manner. The at least one light emitting element comprises a light-transmitting element substrate, a n-type semiconductor layer, a light emitting layer, a p-type semiconductor layer, a first n-electrode, a first p-electrode, a first insulating layer, a second n-electrode and a second p-electrode. The n-type semiconductor layer is disposed on the light-transmitting element substrate. The light emitting layer is disposed on the n-type semiconductor layer. The p-type semiconductor layer is disposed on the light emitting layer. The light emitting layer and the p-type semiconductor layer expose an area of the n-type semiconductor layer. The first n-electrode is disposed on the area of the n-type semiconductor layer. The first p-electrode is disposed on the p-type semiconductor layer. The first insulating layer is disposed on the n-type semiconductor layer so as to insulate the first n-electrode and the first p-electrode from each other. The second n-electrode is disposed on the first n-electrode and the first insulating layer, wherein the second n-electrode has a first area larger than a first joined face between the n-type semiconductor layer and the first n-electrode so that the second n-electrode is electrically connected to the first n-electrode, wherein the second n-electrode is insulated from the first p-electrode by the first insulating layer. The second p-electrode is disposed on the first p-electrode and the first insulating layer, wherein the second p-electrode has a second area smaller than a third area of the light emitting layer, wherein the second p-electrode is electrically connected to the first p-electrode, wherein the second n-electrode and the second p-electrode have same size and are electrically connected and fixed to the mount substrate. The first light transparent member is configured to receive incident light emitted from the light emitting element, wherein the first light transparent member is formed of an inorganic substance and an inorganic phosphor, and the first light transparent member has a top surface and a first side surface contiguous to the top surface. The third light transparent member is disposed on the top surface of the first light transparent member, wherein the third light transparent member is formed of organic substance and contains no phosphor, and the third light transparent member has an externally exposed light emission surface and a third side surface contiguous to the externally exposed light emission surface. The covering member comprises a light reflective material, and surrounds at least the first side surface of the first light transparent member and the third side surface of the third light transparent member. The at least one gap is disposed between the first side surface of the first light transparent member, the third side surface of the third light transparent member and the covering member.

In an embodiment, in the light emitting device provided according to the present invention, the light emitting element is enclosed by the first light transparent member and/or the third light transparent member in a plan view from the externally exposed light emission surface side.

In an embodiment, the double fluorescent glass plates of the light emitting device provided according to the present invention (the upper glass plate contains no phosphor, and the lower glass plate contains phosphor) are manufactured by mixing glass powder and phosphor to obtain various colors of light and sintering them to obtain a lower glass plate (the first light transparent member), and then combining the lower glass plate with the upper glass plate containing no phosphor (the second light transparent member). The feature thereof may at least lies in that: with the material essence of glass, when the aforesaid upper glass plate (the second light transparent member) containing no phosphor and the lower glass plate (the first light transparent member) containing phosphor have not yet been completely sintered, the two kinds of glasses can be combined without using adhesive between the two layers of glass for adhesion, which can improve the reliability tolerance in vehicles; they are sintered with the same glass powder and have the same refractive index, and according to Snell's Law, the loss caused by the reflection of light at the interface may be reduced when n1=n2; and according to the experiment of the applicant of applying the ultra-thin fluorescent patch to LED, a thinner patch can reduce the loss and provide brighter luminance. However, the bottleneck of the thin patch process lies in grinding (for example, the thickness of the thin patch is as small as 50 um). If double-layer glass is used, there is another layer of glass as the substrate, and the fluorescent layer can be made thinner to improve light output. The difficulty lies in that the sintering temperature and time are hard to be controlled, and it is necessary to strike a balance between the sintering temperature and the tolerance of phosphor.

In an embodiment, the double fluorescent glass plates of the light emitting device provided according to the present invention (the upper glass plate contains no phosphor, and the lower glass plate contains phosphor) are manufactured by mixing glass powder and phosphor into various colors and sintering them into a lower glass plate, and then coating the upper surface of the lower glass plate (the first light transparent member) with silicon dioxide by spraying, screen printing, sputtering or evaporating to form a glass layer containing no phosphor on the top layer (the second light transparent member). In this way, no adhesive is required between the two layers of glass for adhesion, the reliability tolerance in vehicles can be improved, and the problem that it is not easy to control the sintering temperature and time confronted when bonding the glass layers by sintering can be solved.

In an embodiment, the light emitting device provided according to the present invention may include a double-layer phosphor in glass (PIG), in which the upper glass layer (the second light transparent member) contains no phosphor and the lower glass layer (the first light transparent member) contains phosphor, so as to reduce the thickness of the glass layer containing phosphor to the lower glass layer while maintaining the thickness of the existing glass patch, thereby improving the light-emitting efficiency.

In an embodiment, the light emitting device provided according to the present invention may include a transparent adhesive layer covering phosphor in glass (PIG) to protect the phosphor in the phosphor in glass from external moisture.

In an embodiment, the light emitting device provided according to the present invention may include a transparent adhesive layer, which may be epoxy or silicon, and may be added with diffusion powder.

In an embodiment, the light emitting device provided according to the present invention may maintain an interval or gap between the phosphor in glass (PIG) and the covering member (which may also be referred to as a white wall or a reflective wall), so as to solve the problem that the covering member expands and causes the phosphor in glass to be damaged or peeled off due to being squeezed.

In an embodiment, the phosphor in glass of the light emitting device provided according to the present invention may be phosphor in ceramic (PIC) or phosphor in inorganic material (PIINOG).

In an embodiment, the upper and lower layers of the double-layer phosphor in glass of the light emitting device provided according to the present invention can be the same or different glass, ceramic or inorganic materials. For example, the upper layer is glass and the lower layer is ceramic and contains phosphor. Alternatively, the upper layer is ceramic and the lower layer is glass and contains phosphor.

To achieve the above objective, the present invention further proposes a backlight module including the light emitting device with the above feature.

To achieve the above objective, the present invention further provides a light-emitting module including the light emitting device with the above feature.

To achieve the above objective, the present invention further provides a car headlight module including the light emitting device with the above feature.

According to the above description, the light emitting device provided according to the present invention can provide at least one or more of the following technical effects:

1. When the light emitting device is used as the lighting source of vehicles or applied to outdoor electronic billboards, it can reduce or avoid the deterioration of the fluorescent layer in high temperature, high humidity and/or sulfur-containing gas, and improve the reliability.

2. It can reduce the thickness of the fluorescent layer and improve the luminous efficiency.

3. Damage and peeling of the fluorescent layer and the light transparent layer covered by the reflective structure due to the difference of expansion coefficients in high temperature environment are avoided.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
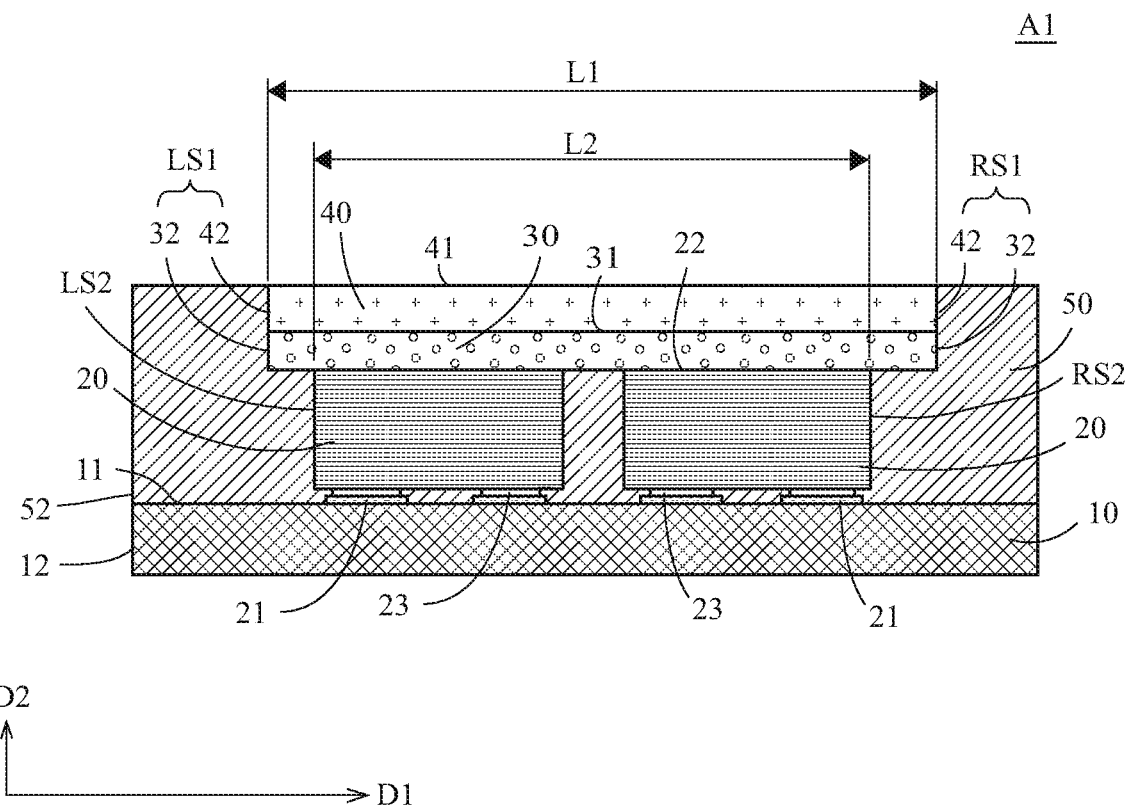
FIG. 1 to FIG. 2 are schematic cross-sectional views of a light emitting device according to a first preferred embodiment of the present invention.

Hereinafter, terms "first", "second", etc. are used to describe various elements, directions, structures and/or sections, and distinguish one element, direction, structure and/or section from another, and these elements, directions, structures and/or sections should not be limited by these terms. Without departing from the teachings of the present invention, a first element, direction, structure and/or section discussed hereinafter may also be referred to as a second element, direction, structure and/or section. In addition, the following orientations (such as horizontal, vertical, left, right, up, down, inside, outside, etc.) are relative orientations and may be defined according to the placement state of the light-emitting structure. In the attached drawings, for the sake of clarity, the sizes and relative sizes of equipments, electrodes, openings, elements, panels, sections, etc. can be exaggerated or reduced.

Hereinafter, embodiments of the present invention will be described according to drawings. However, the embodiments shown below are exemplified to embody the technical idea of the present invention as a light emitting element and the manufacturing method thereof, and the present invention does not limit the light emitting element and the manufacturing method thereof to the configuration described below. Especially, the dimensions, materials, shapes and relative arrangements of the components described in the embodiments are not specifically described but only serve as exemplary examples, and the scope of the present invention is not limited thereto.

However, the dimensions or positional relationships or the like of the components shown in the drawings are exaggerated for the sake of clarity. Furthermore, in order to make this specification easier to understand, the same names and symbols represent the same or homogeneous components, and they are still explained in detail. Furthermore, each element constituting the present invention may also be realized as a plurality of elements composed of the same component, in the form that one component functioning as a plurality of elements, and conversely, it may also be realized so that the functions of one component are shared by a plurality of components. In addition, what is described in some embodiments and implementations can also be used in other embodiments and implementations. In addition, in this specification, the term "above" used for describing orientations above a layer or the like is not necessarily limited to the case where an element is formed in contact with the top of the layer, but also includes the case where an element is formed above the layer with an interval therebetween, and it also includes the case where an intervening layer exists between the layers. However, in this specification, there are also cases where the covered member is described as a sealing member.

Figure 2:
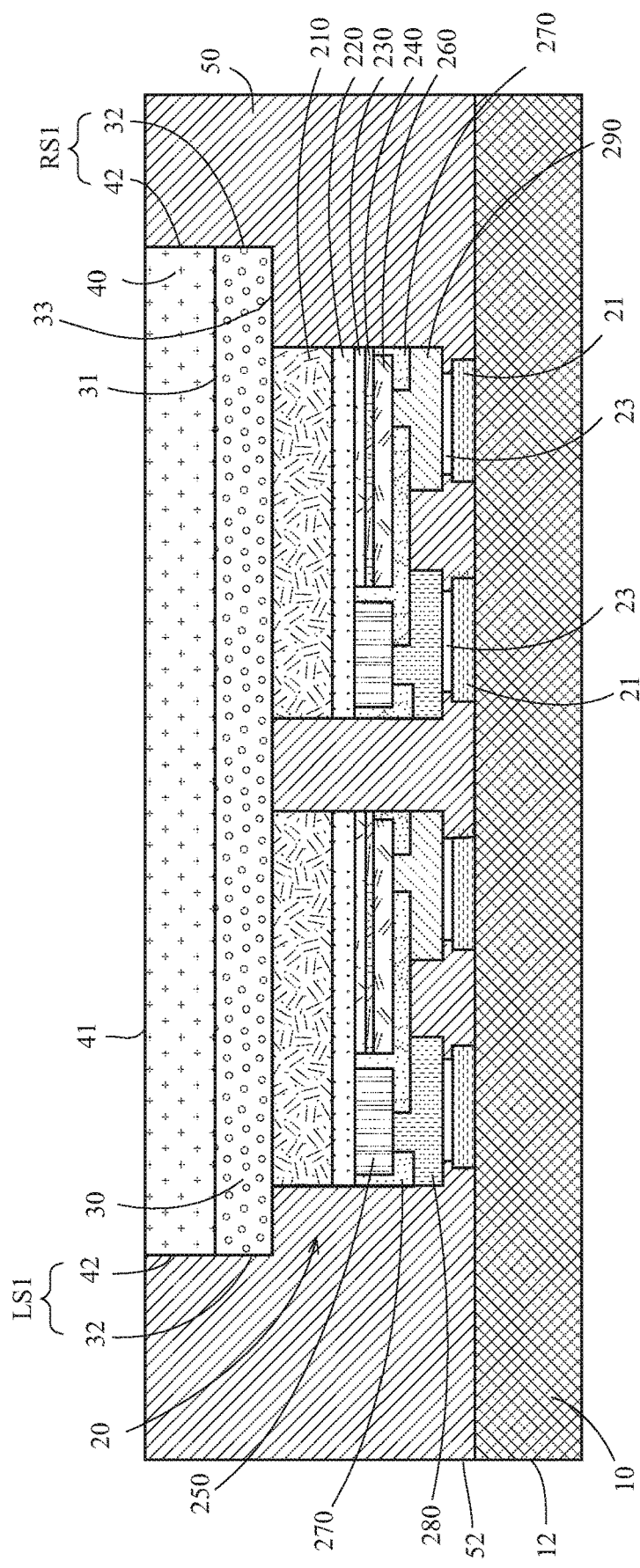

Please refer to FIGS. 1 and 2, which is a schematic cross-sectional view of a light emitting device A1 according to a preferred embodiment of the present invention. The light emitting device A1 may be used as a part of a backlight module, a light-emitting module, and a vehicle head lamp module. As the vehicle head lamp module, the light emitting device may include headlight lens and lens. The light emitting device A1 may comprise a mount substrate 10, at least one light emitting element 20, a first light transparent member 30, a second light transparent member 40, and a covering member 50. That is, the light emitting device A1 may be a single-chip package light emitting device or a multi-chip package light emitting device. The technical contents of the components are described in sequence as follows. The light emitting device may also comprise a lens (not shown).

The mount substrate 10 may be a circuit board or a ceramic substrate defining a horizontal direction D1 and a vertical direction D2 which are perpendicular to each other, and has a surface 11. At least one light emitting element 20 may be an LED chip disposed in a flip-chip manner, and the LED chip may comprise rhodium as an electrode contact layer, and it is disposed on the surface 11 of the mount substrate 10, and is electrically connected with the electrode 21 of the circuit board or the ceramic substrate through a plurality of conductive elements 23 (e.g., solders including tin, silver-tin alloy and/or gold-tin alloy). A schematic cross-sectional view of the light emitting device is shown in the following drawings, in which two light emitting elements 20 can be seen, without being limited thereto.

Figure 3:
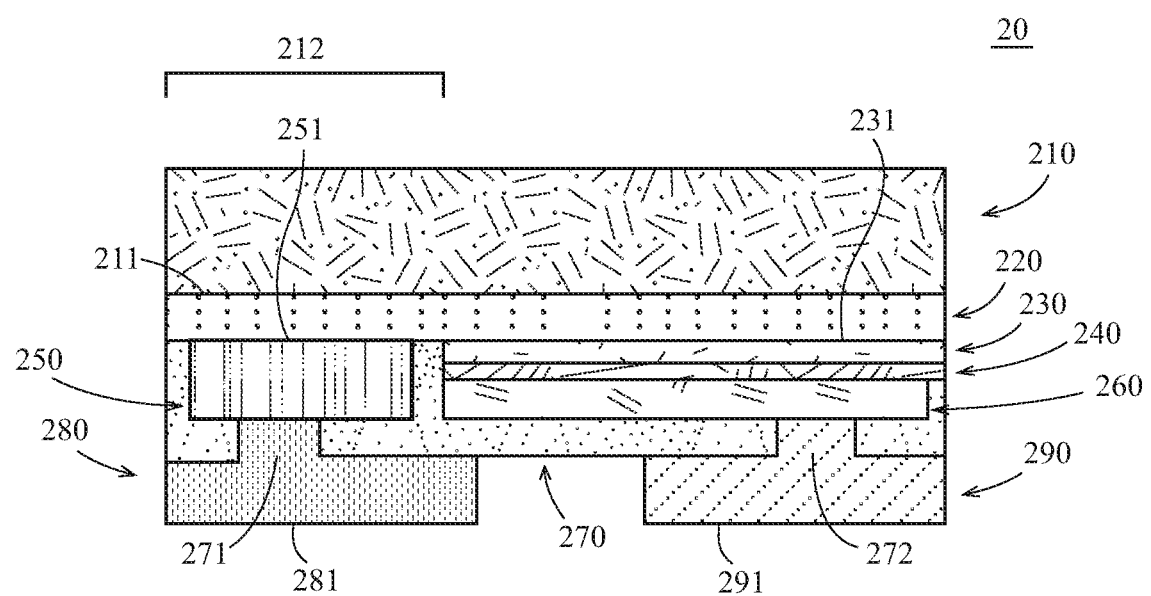
FIG. 3 is a schematic cross-sectional view of a light emitting element of the light emitting device according to FIG. 1.

The light emitting element 20 may be a flip-chip LED chip, which is arranged on the surface 11 of the mount substrate 10 separately along the horizontal direction D1. The light emitting element 20 may be rectangular and comprise a top surface 22. Referring to FIG. 2 and FIG. 3 together, each light emitting element 20 may comprise a light-transmitting element substrate 210, an n-type semiconductor layer 220, a light emitting layer 230, a p-type semiconductor layer 240, a first n-electrode 250, a first p-electrode 260, a first insulating layer 270, a second n-electrode 280 and a second p-electrode 290.

The light-transmitting element substrate 210 may comprise sapphire, ceramic, resin, and thermosetting epoxy resin (EMC). The light-transmitting element substrate 210 comprises a surface 211. An n-type semiconductor layer 220 is disposed on the surface 211 and connected to the light-transmitting element substrate 210. The light emitting layer 230 is disposed on the n-type semiconductor layer 220. The p-type semiconductor layer 240 is disposed on the light emitting layer 230. The p-type semiconductor layer 240 and the light emitting layer 230 expose an area 212 of the n-type semiconductor layer 220, which is an area not covered by the light emitting layer 230 and the p-type semiconductor layer 240, and the p-type semiconductor layer 240 contacts with the n-type semiconductor layer to form the light emitting layer 230. The first n-electrode 250 is disposed on the area 212 of the n-type semiconductor layer 220, is not connected to the p-type semiconductor layer 240, and contacts with the n-type semiconductor layer 220 to form a first joined face 251. The first p-electrode 260 is disposed on the p-type semiconductor layer 240. The first n-electrode 250 and the first p-electrode 260 may be indium tin oxide (ITO) and indium zinc oxide (MO) respectively.

Figure 4A:
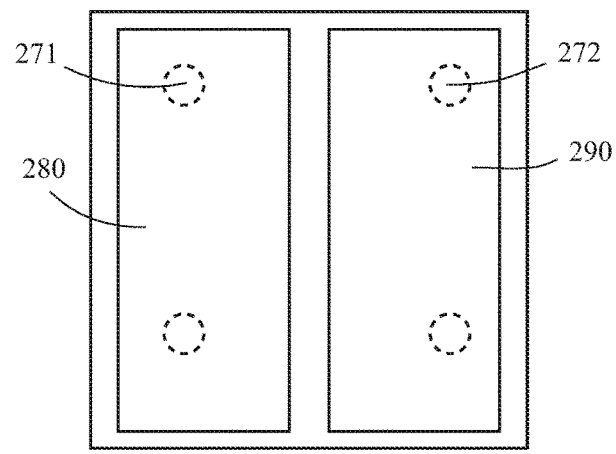
FIG. 4A to FIG. 4C are schematic bottom views of the light emitting element according to FIG. 3.
Figure 4B:
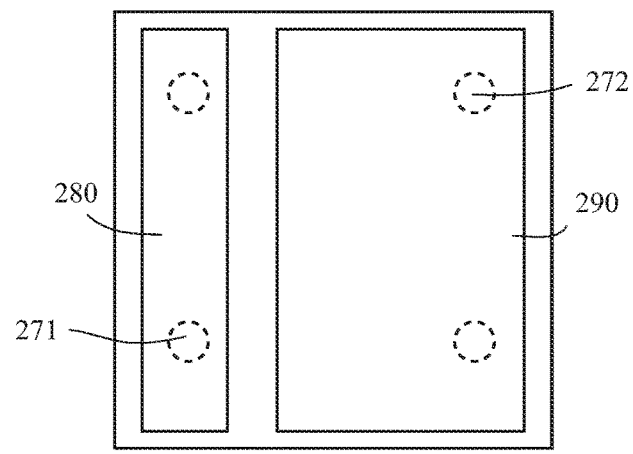
Figure 4C:
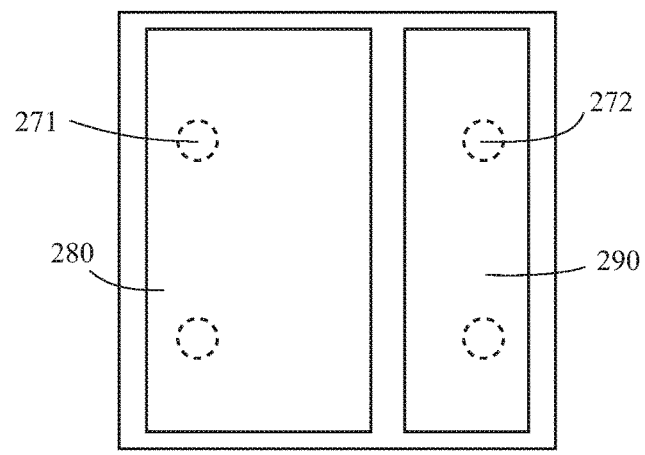

The first insulating layer 270 is disposed on the n-type semiconductor layer 220 between the first n-electrode 250 and the first p-electrode 260 so as to insulate the two electrodes from each other. The first insulating layer 270 completely covers the left and right side surfaces of the first n-electrode 250 as well as the left and right side surfaces of the first p-electrode 260, so that the first n-electrode 250 and the first p-electrode 260 are not electrically connected with each other. The first insulating layer 270 further partially covers the lower side of the first n-electrode 250 and defines a first opening 271, and partially covers the lower side of the first p-electrode 260 and defines at least a second opening 272. The at least one first opening 271 and the at least second opening 272 can be the cylinders extending in a vertical direction D2. The second n-electrode 280 is disposed on the first n-electrode 250 and the first insulating layer 270, and a part thereof is electrically connected with the first n-electrode 250 through the first opening 271. The second n-electrode 280 has a first area 281, and the surface area of the first area 281 is larger than that of the first joined face 251. The second p-electrode 290 is disposed on the first p-electrode 260 and the first insulating layer 270, and a part thereof is electrically connected with the first p-electrode 260 through the second opening 272. The second p-electrode 290 has a second area 291 smaller than a third area 231 of the light emitting layer 230. That is, the surface area of the second area 291 is smaller than that of the third area 231. Thus, as shown in FIG. 4A, the second n-electrode 280 and the second p-electrode 290 have almost the same size (same surface area) when viewed from a bottom surface, and are electrically connected and fixed to the mount substrate 10. Even if the size of the light emitting layer 230 is to be enlarged so as to reduce the size of the first joined face 251, it is still possible to avoid the reduction of production efficiency caused by the need for higher welding accuracy due to size changes when electrically connecting the n-type and p-type electrodes with the mount substrate 10, and it is easier to maintain the uniformity of light emitting, but it is not limited thereto. As shown in FIG. 4B to FIG. 4C, the second n-electrode 280 may also have a size smaller than or larger than that of the second p-electrode 290.

Figure 5:
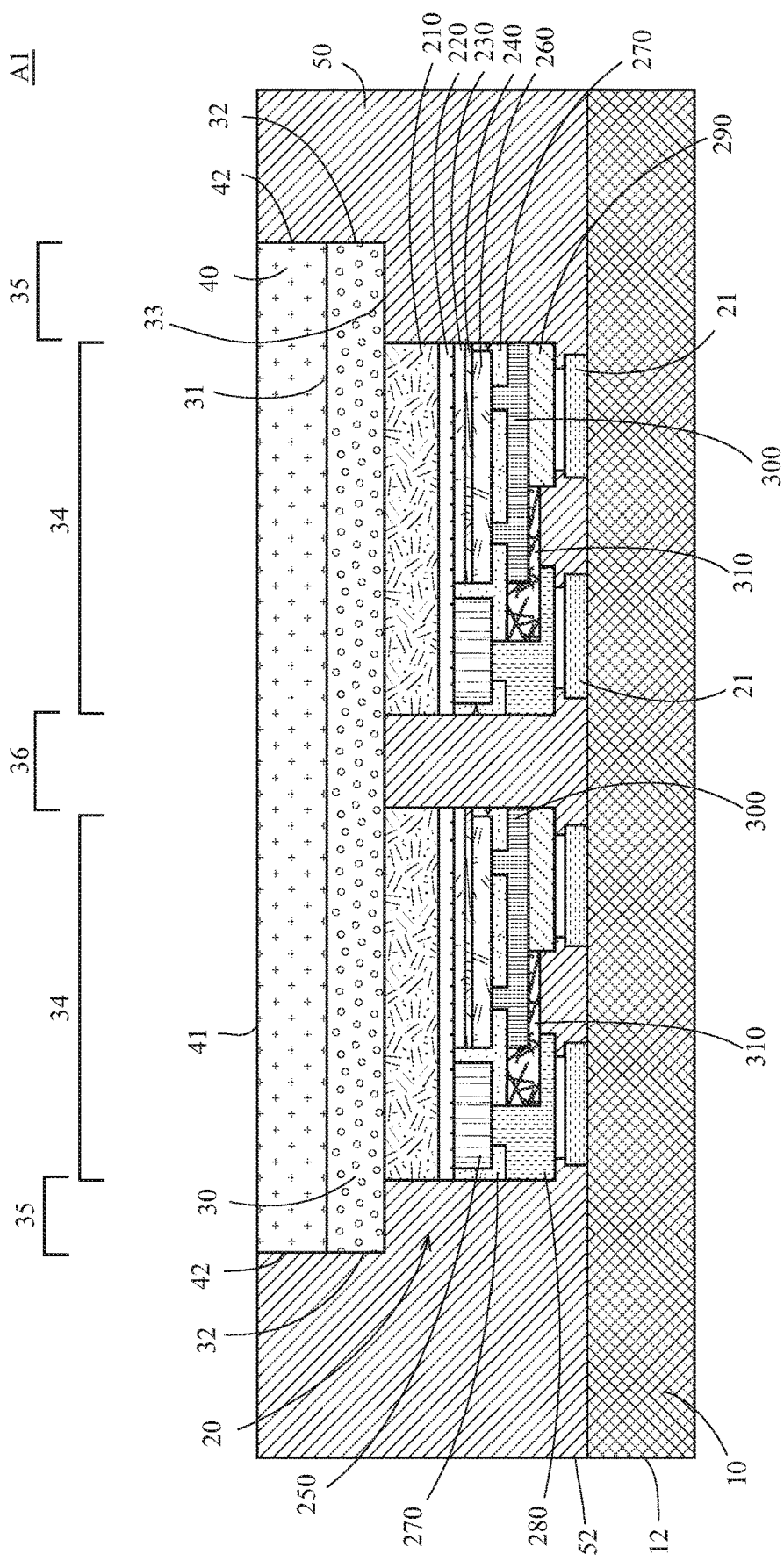
FIG. 5 is another schematic cross-sectional view of the light emitting device according to FIG. 1.
Figure 6:
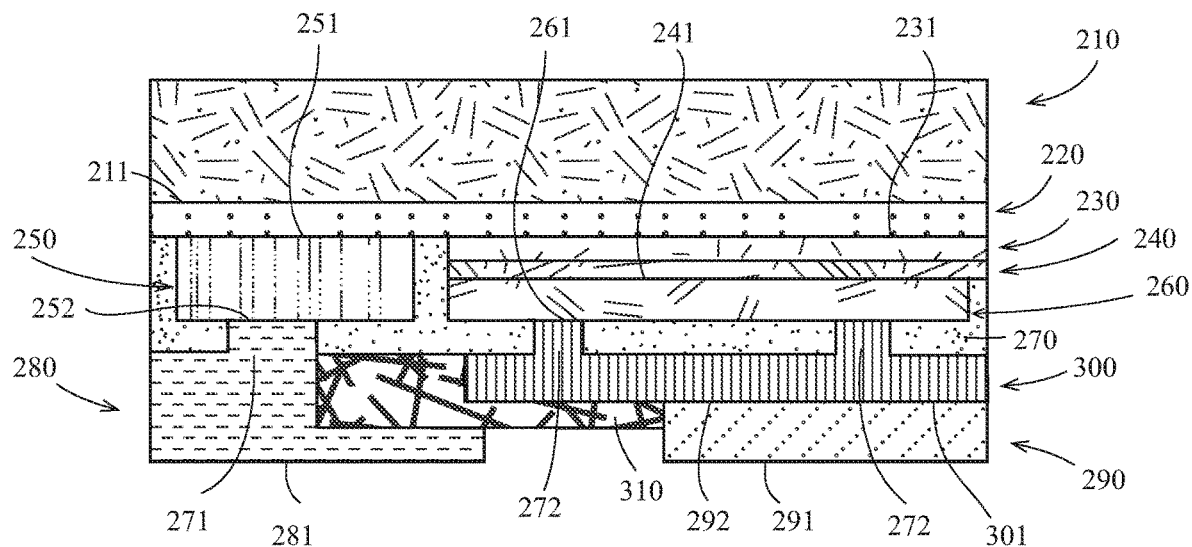
FIG. 6 is another schematic cross-sectional view of the light emitting element of the light emitting device according to FIG. 1.

As shown in FIG. 5 and FIG. 6, the light emitting element 20 may further comprise a conductive layer 300 and a second insulating layer 310. The conductive layer 300 is disposed on the first insulating layer 270 contacting the p-type semiconductor layer 240 to have a fourth area 301 smaller than the third area 231 of the light emitting layer 230 and larger than the second areas 291 of the second p-electrode 290. The conductive layer 300 is electrically connected to the first p-electrode 260 through at least one second opening 272. Since the current density distribution affects the luminescence intensity, a plurality of second openings 272 are uniformly dispersed on the first p-electrode 260. The second insulating layer 310 is disposed between the conductive layer 300 and the second n-electrode 280, completely covering the left side surface of the conductive layer 300, partially covering the left side surface of the second p-electrode 290 and partially covering the right side surface of the second n-electrode 280. The second p-electrode 290 is disposed on the conductive layer 300, so that the second p-electrode 290 has the second area 291, the surface area of the second area 291 is smaller than the second joined face 241 between the p-type semiconductor layer 240 and the first p-electrode 260. That is, the surface area of the second area 291 is smaller than the second joined face 241. Meanwhile, the surface area of the second area 291 may be larger than the third joined face 261 between the first p-electrode 260 and the conductive layer 300, the surface area of the third area 231 of the light emitting layer 230 may be larger than the third joined face 261 between the first p-electrode 260 and the conductive layer 300, the second joined face 241 may be larger than the third joined face 261, the surface area of the first area 281 of the second n-electrode 280 may be larger than the third joined face 261, the surface area of the first area 281 may be smaller than the surface area of the third area 231 of the light emitting layer 230, the surface area of the first area 281 may be smaller than the second joined face 241, the fourth joined face 292 may be smaller than the second joined face 241, the fourth joined face 292 may be smaller than the surface area of the third area 231, the fourth joined face 292 between the second p-electrode 290 and the conductive layer 300 may be larger than the third joined face 261, the fifth joined face 252 between the first n-electrode 250 and the second n-electrode 280 may be smaller than the first joined face 251, the fifth joined face 252 may be smaller than the surface area of the third area 231, the fifth joined face 252 may be smaller than the second joined face 241, the fifth joined face 252 may be smaller than the third joined face 261, and the fifth joined face 252 may be smaller than the fourth joined face 292. The above arrangement may also make the second n-electrode 280 and the second p-electrode 290 have the same size as viewed from a bottom surface.

In addition, the first insulating layer 270 and/or the second insulating layer 310 may comprise a distributed Bragg reflector (DBR), i.e., it may comprise a plurality of first dielectric layers and a plurality of second dielectric layers (not shown) stacked on each other, wherein the refractive index of light in the first dielectric layers is different from the refractive index in the second dielectric layers. The greater the difference in refractive index is, the stronger the reflective light will be when the light strikes the first insulating layer 270 and/or the second dielectric layer 310, thereby increasing the luminous efficiency of the light emitting device.

Please refer to FIG. 1 to FIG. 3 and FIG. 5 to FIG. 6 at the same time, the first light transparent member 30 is disposed on the top surface 22 of at least one light emitting element 20, and may completely or partially cover the top surface 22, such as being connected and fixed to the top surface 22 by an adhesive material. The adhesive material may be a light wavelength conversion member, such as a nitride phosphor which may emit yellow or red light. The first light transparent member 30 may also be adhered to the top surface 22 of the light emitting element 20 through crystal adhesion. The first light transparent member 30 has a light-receiving surface opposite to the light-emitting surface for receiving the incident light emitted by the light emitting element 20. That is, the first light transparent member 30 is optically coupled with the light emitting element 20 and may convert the wavelength of at least a part of the light from the light emitting element 20. The first light transparent member 30 is composed of inorganic substance and inorganic phosphor. The inorganic substance may be, for example, alumina ($Al_2O_3$), glass or ceramic, and the inorganic phosphor is not limited to phosphor of a specific color, but may be red phosphor, green phosphor or yellow phosphor, and may also be composed of phosphors of more than two different colors. Even if the inorganic phosphor is red, green or yellow phosphor of a single color, it may also be composed of one or more different materials. Particularly, taking red phosphor as an example, it may comprise: CASN or SCASN series, such as $CaAlSiN_3:Eu^{2+}$, $Sr, Ca)AlSiN_3$: $Eu^{2+}$, $(SrCa)S:Eu^{2+}$, $CaS:Eu^{2+}$, $Sr_3Si(ON)_5:Eu^{2+}$; KSF series, such as $K_2SiF_6:Mn^{4+}$. It also comprises red phosphor with a general formula of $AE_{1-z}S_{1-y}Se_y: zA$, wherein AE is at least one alkaline earth metal selected from Mg, Ca, Sr and Ba, $0 \leq y < 1$ and $0.0005 \leq z \leq 0.2$, and A is at least one activator selected from Eu(II), Ce(III), Mn(II) and Pr(III). In addition, the green phosphor may comprise $L_2SiO_4:Eu^{2+}$ (L is an alkaline earth metal), especially $(SrBa)_2SiO_4:Eu^{2+}$ or $(SrCa)_2SiO_4:Eu^{2+}$, and it may also be $CaSc_2O_4:Ce^{2+}$, $SrGa_2S:Eu^{2+}$, $\beta$-SiAlON($Si_{6-z}Al_zO_zN_{8-z}:Eu^{2+}$) or LuAG ($Lu_3Al_5O_{12}:Ce^{2+}$) or the like. Taking yellow phosphor as an example, it may comprise $TAG(Tb_3Al_5O_{12}:Ce^{3+})$, YAG ($Y_3Al_5O_{12}:Ce^{3+}$), $Sr_2SiO_4:Eu^{2+}$, $(SrBaCa)Si_2(OCl)_2N_2$: $Eu^{2+}$. In addition, it may also comprise quantum dot phosphor and/or non-quantum dot phosphor, or BAM ($BaMgAl_{10}O_{17}$), BAM:Mn, (Zn, Cd)Zn:Cu, $Sr_5(PO_4)_3Cl$: $Eu^{2+}$, CCA, SCESN, SESN, CESN, CASBN, or phosphor expressed by general formulas of $LSi_2O_2N_2:Eu^{2+}$, $L_xSi_yN_{(2/3x+4/3y)}:Eu^{2+}$, $L_xSi_yO_zN_{(2/3x+4/3y-2/3z)}:Eu^{2+}$ (L is any one of Sr, Ca, Sr and Ca), which may convert the wavelength of at least a part of light from the light emitting element. The concentration of the inorganic phosphor of the first light transparent member 30 may increase from the top surface of the first light transparent member 30 (light-emitting surface) toward the light emitting element or from the light emitting element toward the light-emitting surface. The first light transparent member 30 has a top surface 31 (light-emitting surface) and a first side surface 32 contiguous to the top surface 31. The lower surface 33 (light-receiving surface) of the first light transparent member 30 comprises a joined area 34 and a covering area 35. The joined area 34 is joined to the light emitting element 20, and the covering area 35 is covered by the covering member 50. The light emitting element 20 is separated from each other, and includes a separation area 36 which is disposed on the lower surface 33 of the first light transparent member 30 and is arranged between the joined areas 34, and the separation area 36 is covered by the covering member 50. The first light-transmitting element 30 and/or the second light-transmitting element 40 comprise a protruding area protruding outside relative to the light emitting element 20, and the covering area 35 is disposed in the protruding area of the light receiving surface, the covering member 50 covers the protruding area.

The second light transparent member 40 is disposed on the top surface 31 of the first light transparent member 30, completely covers the first light transparent member 30, and has an externally exposed light emission surface 41 and a second side surface 42 contiguous to the externally exposed light emission surface 41. The second light transparent member 40 is composed only of an inorganic substance and contains no inorganic phosphor.

The covering member 50 contains light reflective materials as white walls and reflective walls. For example, the covering member 50 may comprise at least one oxide in a transparent resin, and the oxide contains elements selected from the group consisting of Ti, Zr, Nb and Al. The covering member 50 surrounds the periphery of the light emitting element 20 and at least covers the first side surface 32 of the first light transparent member 30, or further covers the second side surface 42 of the second light transparent member 40 (which will be further described in detail hereinafter), and comprises a covering side surface 52 that is coplanar with the side surface 12 of the mount substrate 10. In this way, any surface of the first light transparent member 30 is isolated from the air outside, which may effectively avoid or reduce the possibility of deterioration caused by high temperature, high humidity and/or sulfur-containing gas environment.

The manufacturing method of the light emitting device A1 may comprise: mounting the light emitting element 20 on the mount substrate 10 and electrically connecting the light emitting element 20 with the mount substrate 10; optically connecting the at least a part of the mounting side opposite to the light emitting side of the light emitting element 20 to the light transparent member; covering or surrounding the light transparent member along a thickness direction by the covering member, and arranging the covering member so that the outer surface thereof extends along the outer surface of the light transparent member. The light emitting element 20 is enclosed by a first light transparent member 30 or a second light transparent member 40 in a plan view (from top view of the light emitting element 20) from a light emission surface side or an externally exposed light emission surface side 41. In detail, as shown in FIG. 1, FIG. 2 and FIG. 5, a distance L1 exists between the left side LS1 and the right side RS1 of the first light transparent member 30 and the second light transparent member 40, and a distance L2 exists between the left side LS2 of one light emitting element 20 and the right side RS2 of another light emitting element 20 as viewed from the cross section, and the distance L1 is greater than the distance L2.

Figure 7:
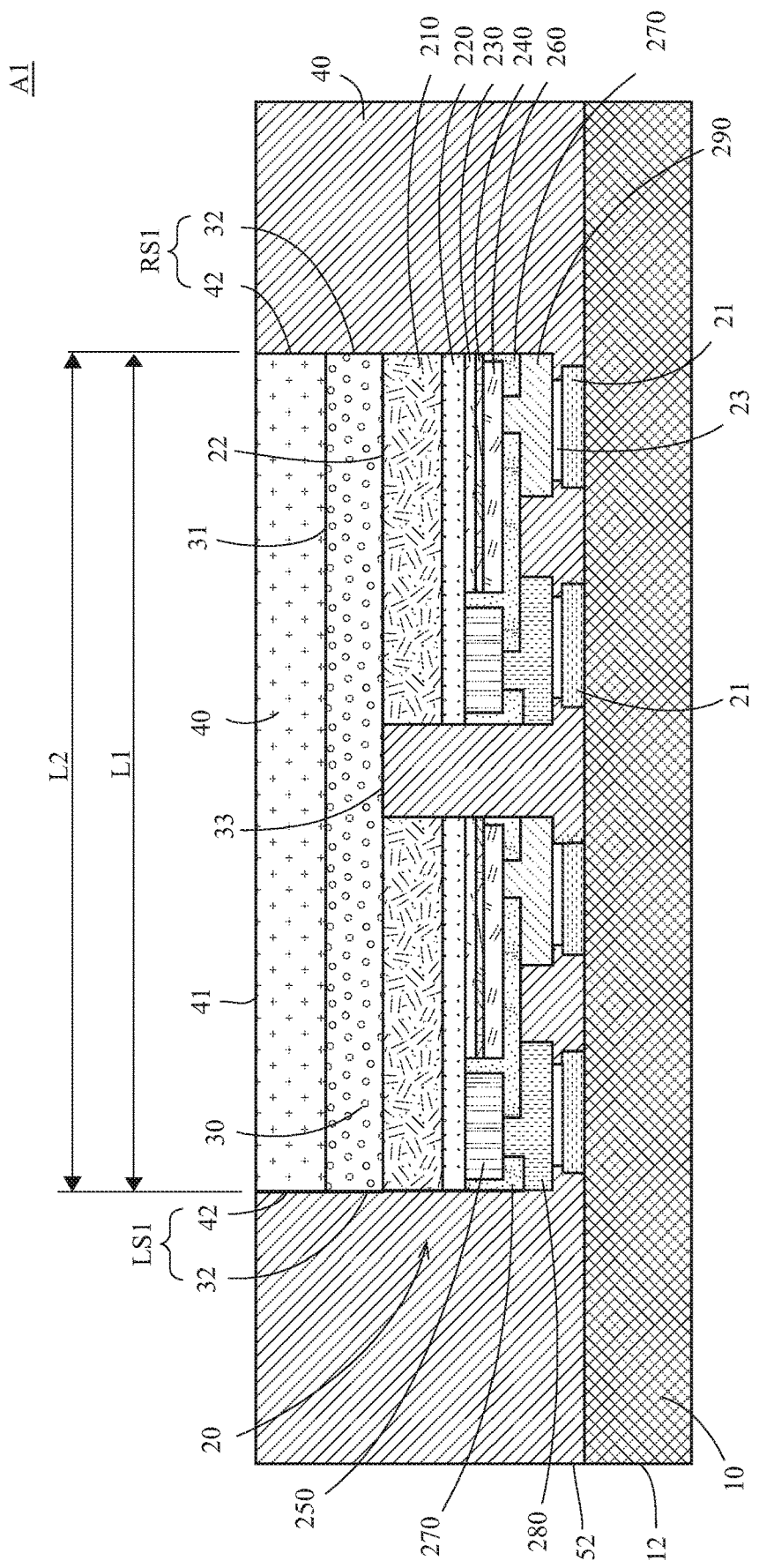
FIG. 7 to FIG. 9 are different schematic cross-sectional views of the light emitting device according to FIG. 1.
Figure 8:
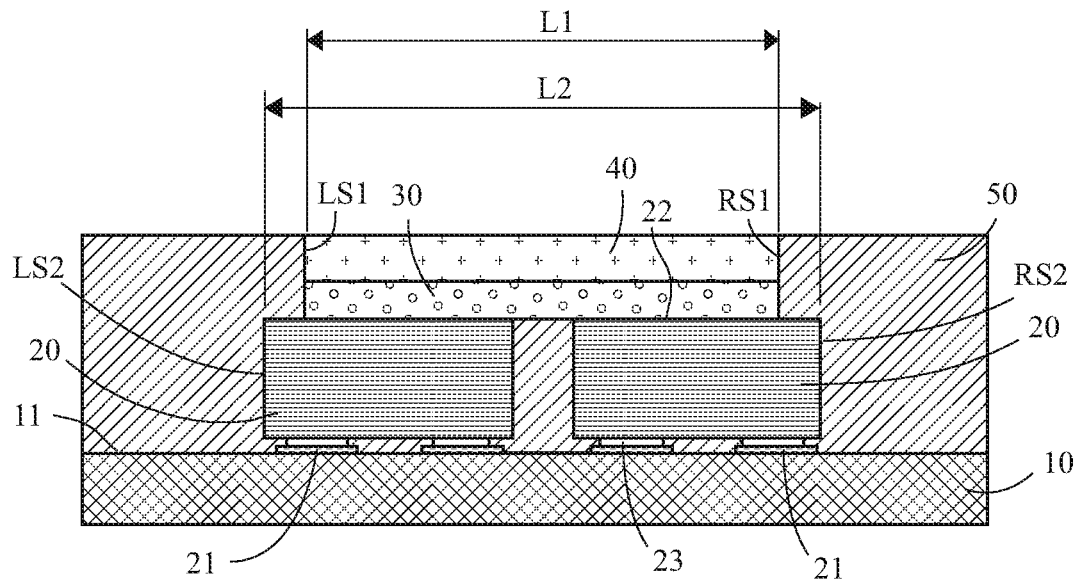

Alternatively, the light emitting element 20 is not enclosed by the first light transparent member 30 or the second light transparent member 40 in a plan view from an externally exposed light emission surface side. In other words, the first side surface 32 of the first light transparent member 30 and the second side surface 42 of the second light transparent member 40 are located within the top surface 22 of the light emitting element 20. In detail, as viewed from the cross section, the distance L1 may be equal to the distance L2 (as shown in FIG. 7) or the distance L1 is smaller than the distance L2 (as shown in FIG. 8).

The second transparent member 40 may be disposed on the first light transparent member 30 by one of sintering, spray coating, screen printing, dispensing, molding, sputtering or evaporating. In case of sintering method, glass powder and phosphor may be mixed and sintered into the first light transparent member 30, and then additional glass powder is sintered into the second transparent member 40. The first light transparent member 30 and the second transparent member 40 are bonded and then sintered again for a more stable bonding (no adhesive is needed). Finally, grinding is performed to make the first light transparent member 30 break through the process limit of separate grinding and become thinner (for example, having a thickness less than 75 μm or less than 50 μm or less than 20 μm), thereby improving the brightness of the light emitting device. Table 1 below shows the comparison results between the thickness of the first light transparent member and the average luminance of the light emitting device installed with the light transparent member.

TABLE 1

| First light transparent member (Size: Width 1,090 × Length 1,090 μm) | | | | | |
|---|---|---|---|---|---|
| Thickness (H) | 200 μm | 150 μm | 100 μm | 75 μm | 50 μm |
| Avg. Luminous (1 m) @ 700 mA | 271 (0%) | 277 (+2.21%) | 285 (+5.17%) | 300 (+10.7%) | 304 (+12.18%) |

Figure 9:
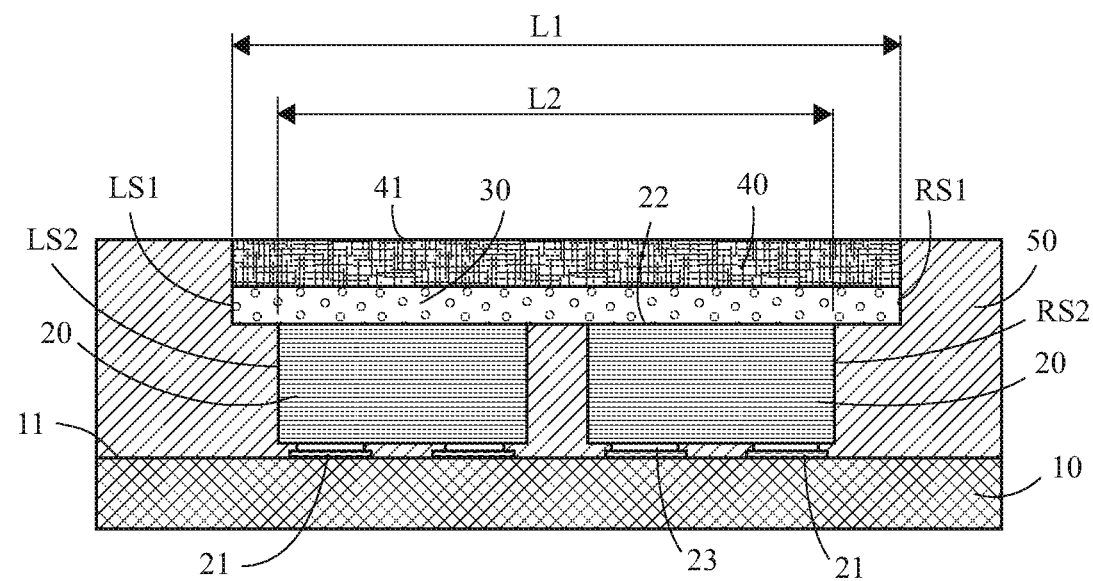

When the second light transparent member 40 is made of inorganic materials, silicon dioxide or other inorganic materials may also preferably be sprayed or evaporated onto the first light transparent member 30, so that the first light transparent member 30 and the second light transparent member 40 are firmly bonded without adhesive, thereby improving the reliability of the LED chip. The second light transparent member 40 may also be made of transparent adhesive, such as epoxy resin or silicone. In addition, the second light transparent member 40 may further comprise a light diffusion agent (as shown in FIG. 9) to increase the luminous efficiency of the light emitting device and make the light more uniform.

Figure 10:
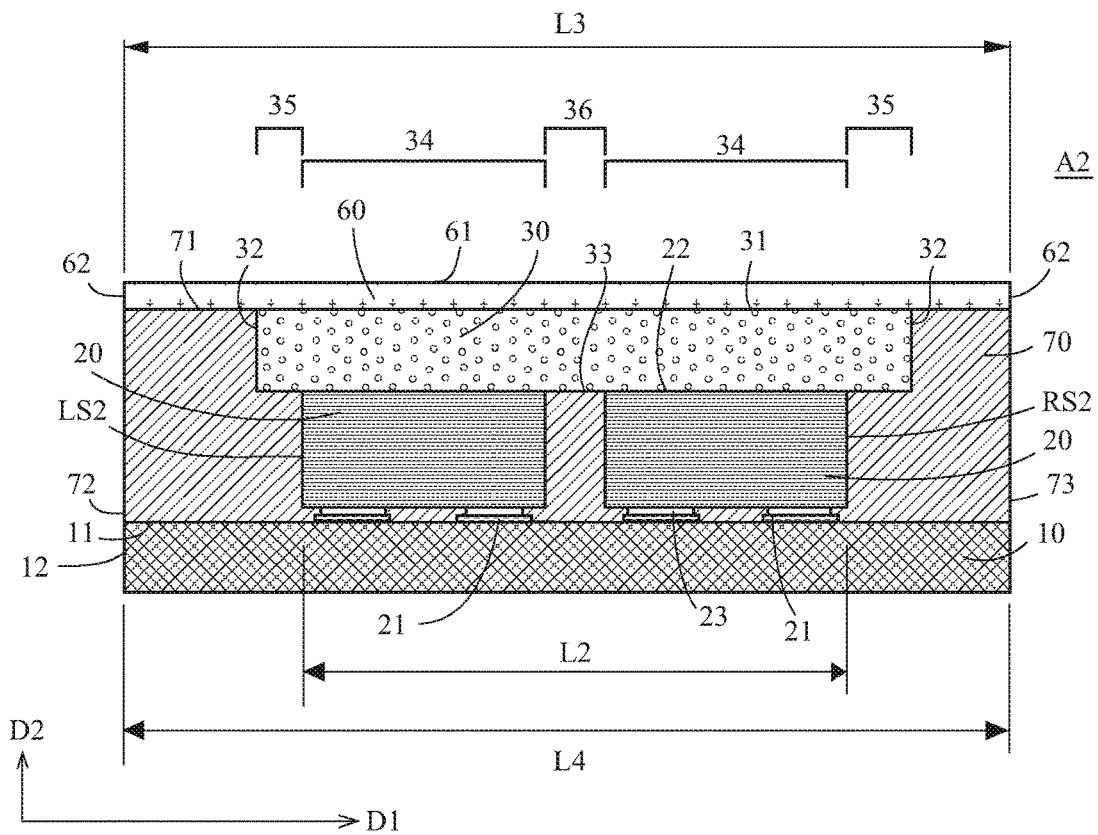
FIG. 10 to FIG. 13 are different schematic cross-sectional views of a light emitting device according to a second preferred embodiment of the present invention.
Figure 11:
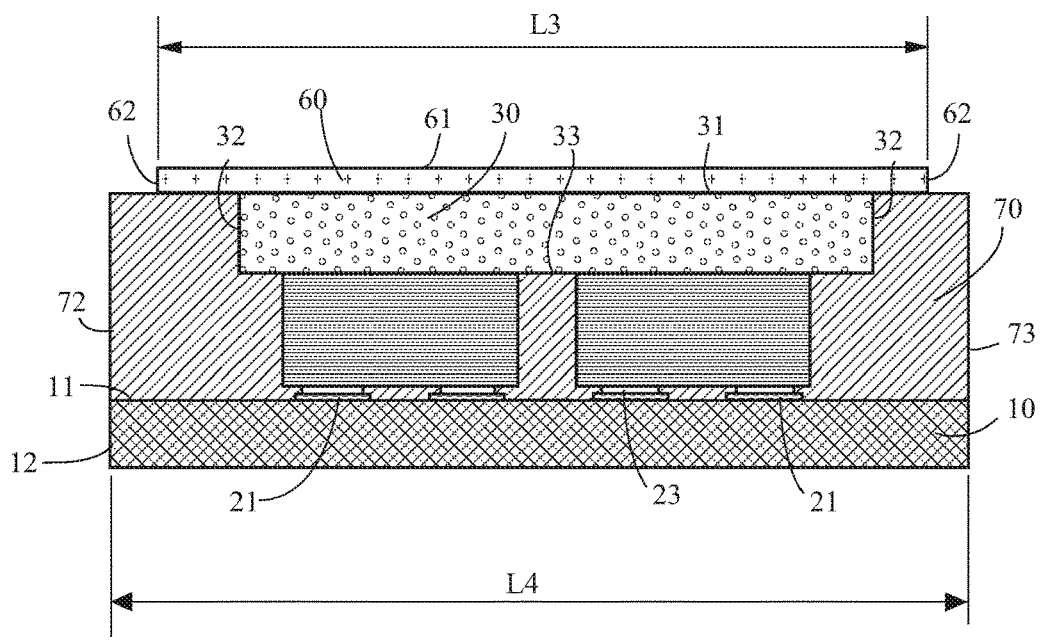

Please continue to refer to FIG. 10 to FIG. 11, which are schematic cross-sectional views of a light emitting device A2 according to a second preferred embodiment of the present invention.

The light emitting device A2 may also be used as a part of a backlight module, a light-emitting module, and a vehicle head lamp module. As the vehicle head lamp module, the light emitting device may include headlight lens and lens. It may comprise a mount substrate 10, at least one light emitting element 20, a first light transparent member 30, a third light transparent member 60 and a covering member 70. The light emitting device A2 may also be a single-chip package light emitting device or a multi-chip package light emitting device. The technical contents of the components are described in sequence as follows.

The mount substrate 10 may be a circuit board or a ceramic substrate, which defines a horizontal direction D1 and a vertical direction D2 which are perpendicular to each other, and has a surface 11. At least one light emitting element 20 may be an LED chip disposed in a flip-chip manner, and the LED chip may comprise rhodium as an electrode contact layer, and it is disposed on the surface 11 of the mount substrate 10, and is electrically connected with the electrode 21 of the circuit board or the ceramic substrate through a plurality of conductive elements 23 (e.g., solders including tin, silver-tin alloy and/or gold-tin alloy). The light emitting device 20 may be a flip-chip LED chip, which is separately arranged on the surface 11 of the mount substrate 10 along the horizontal direction D1. The light emitting device 20 may be rectangular and comprises a top surface 22. Referring to FIG. 3 again at the same time, each light emitting device 20 in this embodiment may comprise a light-transmitting element substrate 210, an n-type semiconductor layer 220, a light emitting layer 230, a p-type semiconductor layer 240, a first n-electrode 250, a first p-electrode 260, a first insulating layer 270, a second n-electrode 280 and a second p-electrode 290.

The light-transmitting element substrate 210 may comprise sapphire, ceramic, resin, and thermosetting epoxy resin (EMC). The light-transmitting element substrate 210 comprises a surface 211. The n-type semiconductor layer 220 is disposed on the surface 211 and connected to the light-transmitting element substrate 210. The light emitting layer 230 is disposed on the n-type semiconductor layer 220. The p-type semiconductor layer 240 is disposed on the light emitting layer 230, the light emitting layer 230 and the p-type semiconductor layer 240 expose an area 212 of the n-type semiconductor layer 220, which is an area uncovered by the light emitting layer 230 and the p-type semiconductor layer 240, and the p-type semiconductor layer 240 contacts with the n-type semiconductor layer to form the light emitting layer 230. The first n-electrode 250 is disposed on the area 212 of the n-type semiconductor layer 220, is not connected with the p-type semiconductor layer 240, and makes contact with the n-type semiconductor layer 220 to form a first joined face 251. The first p-electrode 260 is disposed on the p-type semiconductor layer 240. The first n-electrode 250 and the first p-electrode 260 may be respectively indium tin oxide (ITO) and indium zinc oxide (IZO).

The first insulating layer 270 is disposed on the n-type semiconductor layer 220 between the first n-electrode 250 and the first p-electrode 260 so as to insulate the two electrodes from each other. The first insulating layer 270 completely covers the left and right side surfaces of the first n-electrode 250 as well as the left and right side surfaces of the first p-electrode 260, so that the first n-electrode 250 and the first p-electrode 260 are not electrically connected with each other. The first insulating layer 270 further partially covers the lower side of the first n-electrode 250 and defines a first opening 271, and partially covers the lower side of the first p-electrode 260 and defines at least a second opening 272. The first opening 271 and the at least second opening 272 may be cylinders extending in the vertical direction D2. The second n-electrode 280 is disposed on the first n-electrode 250 and the first insulating layer 270, and a part thereof is electrically connected with the first n-electrode 250 through the first opening 271. The second n-electrode 280 has a first area 281, and the surface area of the first area 281 is larger than that of the first joined face 251. The second p-electrode 290 is disposed on the first p-electrode 260 and the first insulating layer 270, and a part thereof is electrically connected with the first p-electrode 260 through the second opening 272. The second p-electrode 290 has a second area 291 smaller than a third area 231 of the light emitting layer 230. That is, the surface area of the second area 291 is smaller than that of the third area 231. Thus, referring to FIG. 4A again at the same time, the second n-electrode 280 and the second p-electrode 290 in this embodiment have almost the same size (same surface area) when viewed from a bottom surface, and are electrically connected and fixed to the mount substrate 10. In this way, even if the size of the light emitting layer 230 is to be enlarged so as to reduce the size of the first joined face 251, it is still possible to avoid the reduction of production efficiency caused by the need for higher welding accuracy due to size changes when electrically connecting the n-type and p-type electrodes with the mount substrate 10, and it is easier to maintain the uniformity of light emitting, but it is not limited thereto. Referring to FIG. 4B to FIG. 4C again at the same time, the second n-electrode 280 in this embodiment may also have a size smaller than or larger than that of the second p-electrode 290.

Referring to FIG. 5 and FIG. 6 again at the same time, the light emitting element 20 in this embodiment may further comprise a conductive layer 300 and a second insulating layer 310. The conductive layer 300 is disposed on the first insulating layer 270 contacting the p-type semiconductor layer 240 to have a fourth area 301 smaller than the third area 231 of the light emitting layer 230 and larger than the second areas 291 of the second p-electrode 290. The conductive layer 300 is electrically connected to the first p-electrode 260 through at least one second opening 272. Since the current density distribution affects the luminescence intensity, a plurality of second openings 272 may be uniformly dispersed on the first p-electrode 260. The second insulating layer 310 is disposed between the conductive layer 300 and the second n-electrode 280, completely covering the left side surface of the conductive layer 300, partially covering the left side surface of the second p-electrode 290 and partially covering the right side surface of the second n-electrode 280. The second p-electrode 290 is disposed on the conductive layer 300, so that the second p-electrode 290 has the second area 291 that is smaller than the second joined face 241 between the p-type semiconductor layer 240 and the first p-electrode 260. The second joined face 241 may be larger than the third joined face 262. Meanwhile, the surface area of the second area 291 may be larger than the third joined face 261 between the first p-electrode 260 and the conductive layer 300, the surface area of the third area 231 of the light emitting layer 230 may be larger than the third joined face 261 between the first p-electrode 260 and the conductive layer 300, the surface area of the first area 281 of the second n-electrode 280 may be larger than the third joined face 261, the surface area of the first area 281 may be smaller than the surface area of the third area 231 of the light emitting layer 230, the surface area of the first area 281 may be smaller than the second joined face 241, the fourth joined face 292 may be smaller than the second joined face 241, the fourth joined face 292 may be smaller than the surface area of the third area 231 of the light emitting layer 230, the fourth joined face 292 between the second p-electrode 290 and the conductive layer 300 may be larger than the third joined face 261, the fifth joined face 252 between the first n-electrode 250 and the second n-electrode 280 may be smaller than the first joined face 251, the fifth joined face 252 may be smaller than the surface area of the third area 231, the fifth joined face 252 may be smaller than the second joined face 241, the fifth joined face 252 may be smaller than the third joined face 261, and the fifth joined face 252 may be smaller than the fourth joined face 292. The above arrangement may also make the second n-electrode 280 and the second p-electrode 290 have the same size as viewed from a bottom surface.

In addition, the first insulating layer 270 and/or a second insulating layer 310 may comprise a distributed Bragg reflector (DBR), i.e., it may comprise a plurality of first dielectric layers and a plurality of second dielectric layers (not shown) stacked on each other, wherein the refractive index of light in the first dielectric layers is different from the refractive index in the second dielectric layers. The greater the difference in refractive index is, the stronger the reflective light will be when the light strikes the first insulating layer 270 and/or a second dielectric layer 310, thereby increasing the luminous efficiency of the light emitting device.

Referring to FIG. 1 to FIG. 3 and FIG. 5 to FIG. 6 at the same time, the first light transparent member 30 is disposed on the top surface 22 of at least one light emitting element 20, and may completely or partially cover the top surface 22, such as being connected and fixed to the top surface 22 by an adhesive material. The adhesive material may be a light wavelength conversion member, such as a nitride phosphor which may emit yellow or red light. The first light transparent member 30 may also be adhered to the top surface 22 of the light emitting element 20 through crystal adhesion. The first light transparent member 30 has a light-receiving surface opposite to the light-emitting surface for receiving the incident light emitted by the light emitting element 20. That is, the light emitting element 20 is optically coupled with the first light transparent member 30. The first light transparent member 30 is composed of inorganic substance and inorganic phosphor. The inorganic substance may be, for example, alumina ($Al_2O_3$), glass or ceramic, and the inorganic phosphor is not limited to phosphor of a specific color, but may be red phosphor, green phosphor or yellow phosphor, and may also be composed of phosphors of more than two different colors. Even if the inorganic phosphor is red, green or yellow phosphor of a single color, it may be composed of one or more different materials. Particularly, taking red phosphor as an example, it may comprise: CASN or SCASN series, such as $CaAlSiN_3:Eu^{2+}$, Sr, $Ca)AlSiN_3$: $Eu^{2+}$, $(SrCa)S:Eu^{2+}$, $CaS:Eu^{2+}$, $Sr_3Si(ON)_5:Eu^{2+}$; KSF series, such as $K_2SiF_6:Mn^{4+}$. It also comprises red phosphor with a general formula of $AE_{1-z}Si_{1-y}Se_y$: zA, wherein AE is at least one alkaline earth metal selected from Mg, Ca, Sr and Ba, $0 \le y < 1$ and $0.0005 \le z \le 0.2$, and A is at least one activator selected from Eu(II), Ce(III), Mn(II) and Pr(III). In addition, the green phosphor may comprise $L_2SiO_4:Eu^{2+}$ (L is an alkaline earth metal), especially $(SrBa)_2SiO_4:Eu^{2+}$ or $(SrCa)_2SiO_4:Eu^{2+}$, and it may also be $CaSc_2O_4:Ce^{2+}$, $SrGa_2S:Eu^{2+}$, β-SiAlON($Si_{6-z}Al_zO_zN_{8-z}:Eu^{2+}$) or LuAG ($Lu_3Al_5O_{12}:Ce^{2+}$) or the like. Taking yellow phosphor as an example, it may comprise $TAG(Tb_3Al_5O_{12}:Ce^{3+})$, YAG ($Y_3Al_5O_{12}:Ce^{3+}$), $Sr_2SiO_4:Eu^{2+}$, $(SrBaCa)Si_2(OCl)_2N_2$: $Eu^{2+}$. In addition, it may also comprise quantum dot phosphor and/or non-quantum dot phosphor, or BAM ($BaMgAl_{10}O_{17}$), BAM:Mn, (Zn, Cd)Zn:Cu, $Sr_5(PO_4)_3Cl$: $Eu^{2+}$, CCA, SCESN, SESN, CESN, CASBN, or phosphor expressed by general formulas of $LSi_2O_2N_2:Eu^{2+}$, $L_xSi_y N_{(2/3x+4/3y)}:Eu^{2+}$, $L_xSi_yO_zN_{(2/3x+4/3y-2/3z)}:Eu^{2+}$ (L is any one of Sr, Ca, Sr and Ca), which may convert the wavelength of at least a part of light from the light emitting element. The concentration of the inorganic phosphor of the first light transparent member 30 may increase from the top surface of the first light transparent member (light-emitting surface) toward the light emitting element or from the light emitting element toward the light-emitting surface. The first light transparent member 30 has a top surface 31 (light-emitting surface) and a first side surface 32 contiguous to the top surface 31. The lower surface 33 (light-receiving surface) of the first light transparent member 30 comprises a joined area 34 and a covering area 35. The joined area 34 is joined to the light emitting element 20, and the covering area 35 is covered by the covering member 70. The light emitting elements 20 are separated from each other, and include a separation area 36 which is disposed on the lower surface 33 of the first light transparent member 30 and is arranged between the joined areas 34, and the separation area 36 is covered by the covering member 70. The first light transparent member 30 and/or the third light transparent member 60 comprise a protruding area protruding outside relative to the light emitting element 20, and the covering area 35 is disposed in the protruding area of the light receiving surface, and the covering member 70 may cover the protruding area.

The third light transparent member 60 is disposed on the top surface 31 of the first light transparent member 30, completely covers the first light transparent member 30, and has an externally exposed light emission surface 61 and a second side surface 62 contiguous to the externally exposed light emission surface 61. The third light transparent member 60 is composed of an organic substance and contains no phosphor.

The covering member 70 contains light reflective materials as white walls and reflective walls. For example, the covering member 70 may comprise at least one oxide in a transparent resin, and the oxide contains one selected from the group consisting of titanium (Ti), zirconium (Zr), niobium (Nb) and aluminum (Al) as the light reflective material. The covering member 70 surrounds the periphery of the light emitting element 20 and covers the first side surface 32 of the first light transparent member 30, and the covering member 70 may comprise covering side surfaces 72 and 73 that are extending along the vertical direction D2 and coplanar with the side surface 12 of the mount substrate 10 that extends along the vertical direction D2. In this way, any surface of the first light transparent member 30 is isolated from the air outside, which may effectively avoid or reduce the possibility of deterioration caused by high temperature, high humidity and/or sulfur-containing gas environment.

The manufacturing method of the light emitting device A2 may comprise: mounting the light emitting element 20 on the mount substrate 10 and electrically connecting the light emitting element 20 with the mount substrate 10; optically connecting the at least a part of the light emitting side opposite to the mounting side of the light emitting element 20 to the first light transparent member 30; covering or surrounding the first light transparent member 30 along a vertical direction D2 by the covering member 70, and arranging the covering member 70 so that the outer surface thereof extends along the outer surface of the light transparent member. The light emitting element 20 is enclosed by the first light transparent member 30 or the third light transparent member 60 in a plan view from a light emission surface side or an externally exposed light emission surface 61. In detail, referring to FIG. 1, FIG. 2 and FIG. 5 again together with FIG. 10 and FIG. 11, a distance L2 exists between the left side LS2 of a light emitting element 20 and the right side RS2 of another light emitting element 20, a distance that is larger than the distance L2 exists between two opposite sides (light side to right side) of the first side surface 32 of the first light transparent member 30, a distance L3 exists between the left side and the right side of the third light transparent member 60, and the distance L3 may be larger than a distance of the first light transparent member 30 and much larger than the distance L2.

Alternatively, the light emitting element 20 is not enclosed by the first light transparent member 30 in a plan view from an externally exposed light emission surface side. In other words, the first side surface 32 of the first light transparent member 30 is located within the top surface 22 of the light emitting element 20 (not shown). In detail, as viewed from the cross section, a distance between two opposite sides of the first side surface 32 of the first light transparent member 30 is smaller than the distance L2, a distance L3 exists between the left side and the right side of the third light transparent member 60, and the distance L3 may still be larger than a distance of the first light transparent member 30 and much larger than the distance L2.

The third light transparent member 60 is only made of an organic substance and contains no phosphor, and has an externally exposed light emission surface 61 and a third side surface 62 contiguous to the externally exposed light emission surface. The covering member 70 may only cover the first side surface 32 of the first light transparent member 30 and has a top surface 71. Therefore, in addition to the top surface 31 of the first light transparent member 30, the third light transparent member 60 may further partially or completely cover the top surface 71, but it is not limited thereto. The covering member 70 may also only partially cover the first side surface 32 of the first light transparent member 30.

Figure 12:
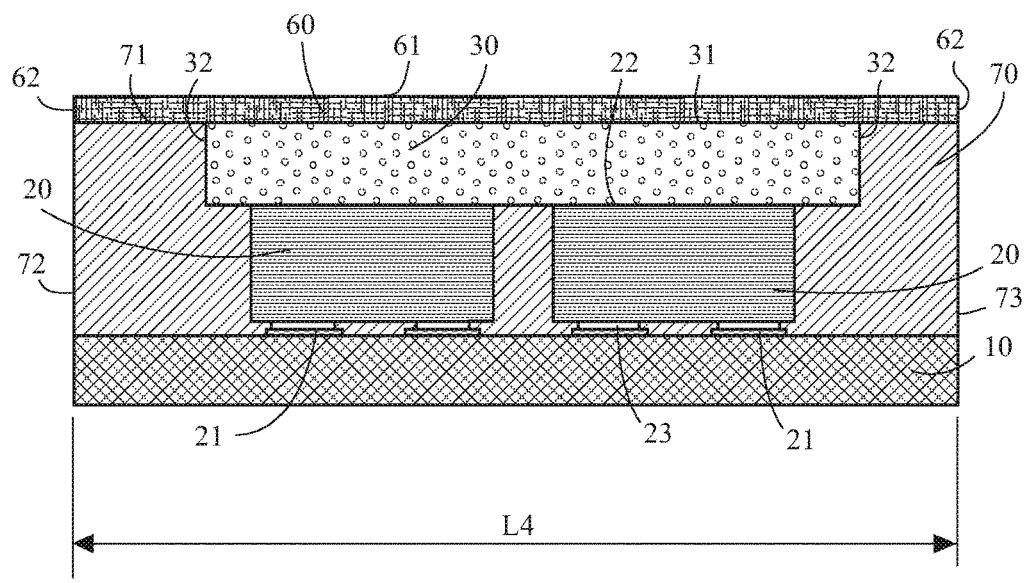
Figure 13:
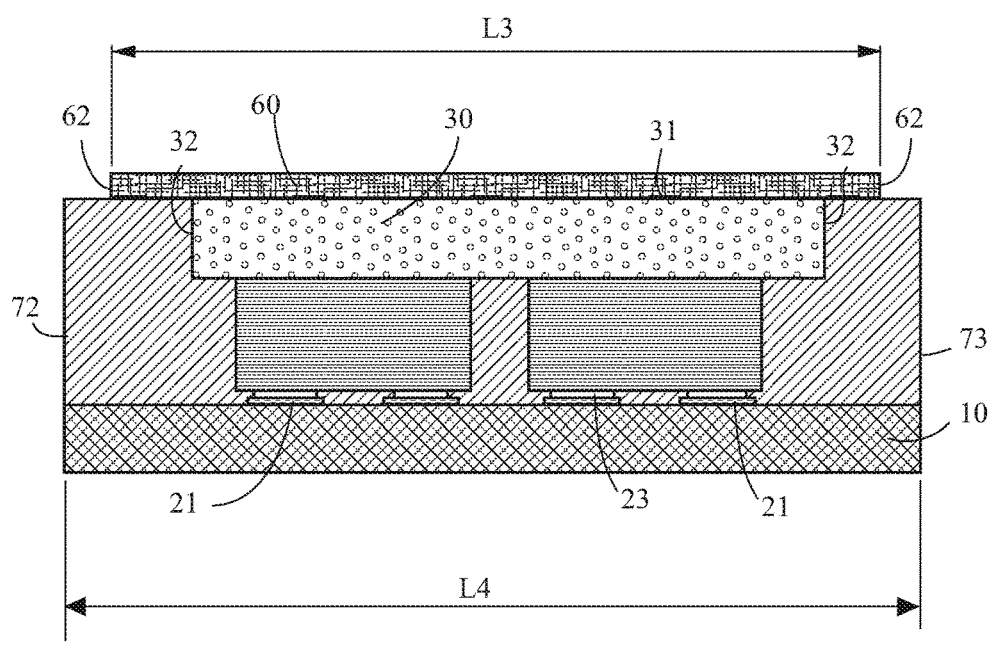

The third light transparent member 60 may be disposed on the first light transparent member 30 by one of spray coating, screen printing, dispensing or molding. For example by spray coating, after the package of the light emitting device A2 is completed. That is, the third light transparent member 60 is disposed after the top surface 71 of the covering member 70 is coplanar with the top surface 31 of the first light transparent member 30. A third distance L3 exists between two of the third side surfaces 62 of the third light transparent member 60 opposite along the horizontal direction D1, and the outermost side surface of the covering member 70 includes the reflective structure surface 72 and the reflective structure surface 73 which has a fourth distance L4 therebetween along the horizontal direction D1. As shown in FIG. 10, the third distance L3 may be equal to the fourth distance L4 (manufacturing errors may be tolerated), so that the third side surface 62 is coplanar with the outermost side surface of the covering member 70 (includes the reflective structure surfaces 72 and the reflective structure surfaces 73) to protect the first light transparent member 30. As shown in FIG. 11, the third distance L3 may also be smaller than the fourth distance L4. That is, when viewed from the top of the light emitting device A2, the third side surface 62 of the third light transparent member 60 is located inside the outermost side surface of the covering member 70, but it is still larger than a distance between two of first side surfaces 32 of the first light transparent member 30 opposite in the horizontal direction D1. The third light transparent member 60 may further comprise a light diffusion agent (as shown in FIG. 12 to FIG. 13) to increase the luminous efficiency of the light-emitting device and improve the light uniformity.

Figure 14:
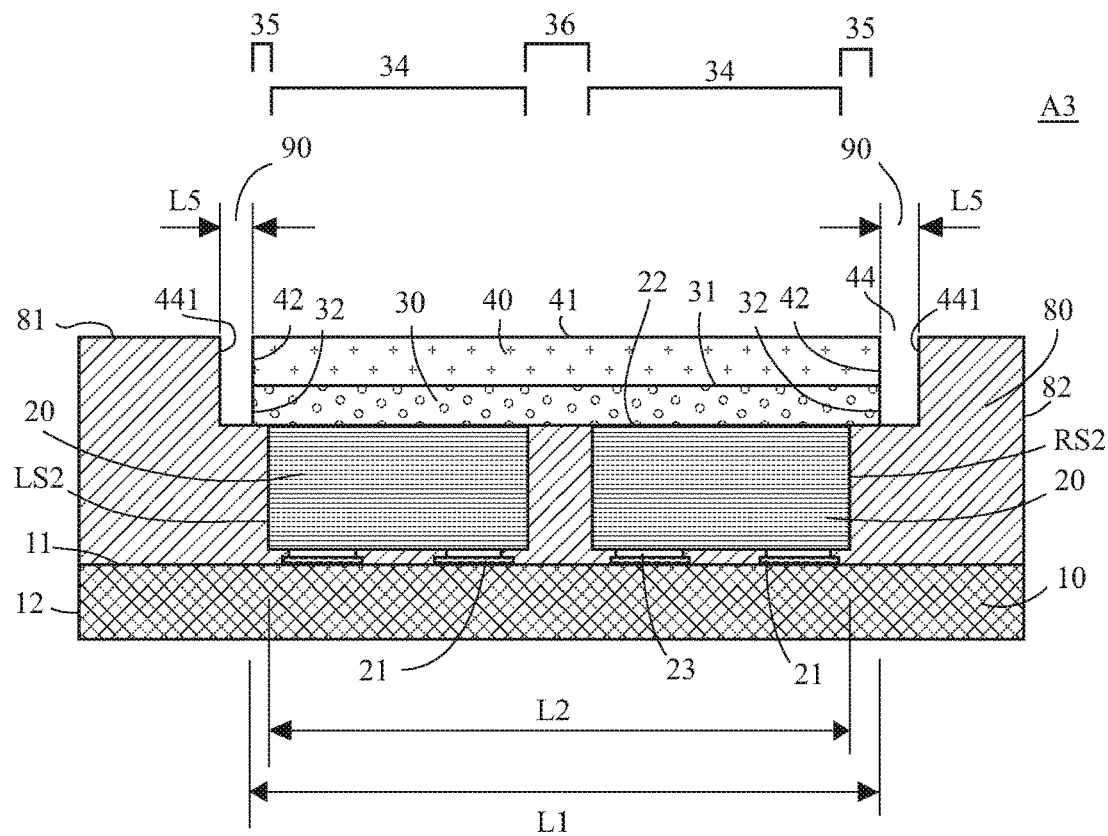
FIG. 14 to FIG. 16 are different schematic cross-sectional views of a light emitting device according to a third preferred embodiment of the present invention.
Figure 15:
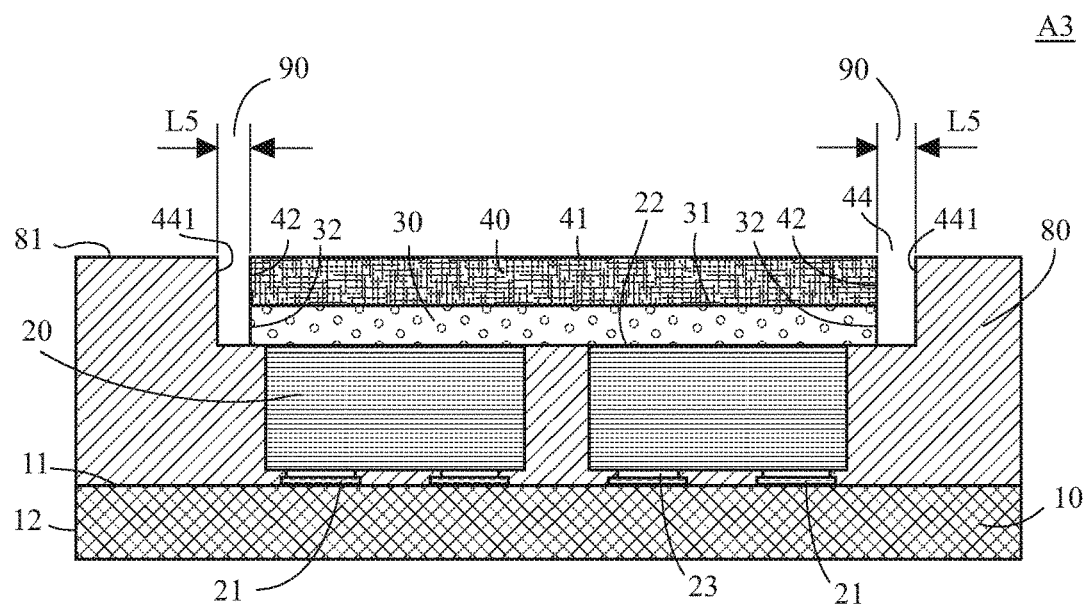

Please continue to refer to FIG. 14 to FIG. 15, which are schematic cross-sectional views of a light emitting device A3 according to a third preferred embodiment of the present invention.

The light emitting device A3 may also be used as a part of a backlight module, a light-emitting module, and a vehicle head lamp module. As the vehicle head lamp module, the light emitting device may include headlight lens and lens. It may comprise a mount substrate 10, at least one light emitting element 20, a first light transparent member 30, a second light transparent member 40, a covering member 80 and at least one gap 90. The light emitting device A3 may be a single-chip package light emitting device or a multi-chip package light emitting device. The technical contents of the components are described in sequence as follows.

As shown in FIG. 14 and FIG. 15, the mount substrate 10 may be a circuit board or a ceramic substrate, which defines a horizontal direction D1 and a vertical direction D2 which are perpendicular to each other, and has a surface 11. At least one light emitting element 20 may be an LED chip disposed in a flip-chip manner, and the LED chip may comprise rhodium as an electrode contact layer, and it is disposed on the surface 11 of the mount substrate 10, and is electrically connected with the electrode 21 of the circuit board or the ceramic substrate through a plurality of conductive elements 23 (e.g., solders including tin, silver-tin alloy and/or gold-tin alloy). A schematic cross-sectional view of the light emitting device A3 is shown in the following drawings, in which two light emitting elements 20 can be seen, without being limited thereto.

The light emitting device 20 may be a flip-chip LED chip, which is separately arranged on the surface 11 of the mount substrate 10 along the horizontal direction D1. The light emitting device 20 may be rectangular and comprises a top surface 22. Referring to FIG. 3 again at the same time, each light emitting device 20 in this embodiment may comprise a light-transmitting element substrate 210, an n-type semiconductor layer 220, a light emitting layer 230, a p-type semiconductor layer 240, a first n-electrode 250, a first p-electrode 260, a first insulating layer 270, a second n-electrode 280 and a second p-electrode 290.

The light-transmitting element substrate 210 may comprise sapphire, ceramic, resin, thermosetting epoxy resin (EMC). The light-transmitting element substrate 210 comprises a surface 211. The n-type semiconductor layer 220 is disposed on the surface 211 and connected to the light-transmitting element substrate 210. The light emitting layer 230 is disposed on the n-type semiconductor layer 220. The p-type semiconductor layer 240 is disposed on the light emitting layer 230, the light emitting layer 230 and the p-type semiconductor layer 240 expose an area 212 of the n-type semiconductor layer 220, which is an area uncovered by the light emitting layer 230 and the p-type semiconductor layer 240, and the p-type semiconductor layer 240 contacts with the n-type semiconductor layer to form the light emitting layer 230. The first n-electrode 250 is disposed on the area 212 of the n-type semiconductor layer 220, is not connected with the p-type semiconductor layer 240, and makes contact with the n-type semiconductor layer 220 to form a first joined face 251. The first p-electrode 260 is disposed on the p-type semiconductor layer 240. The first n-electrode 250 and the first p-electrode 260 may be respectively indium tin oxide (ITO) and indium zinc oxide (IZO).

The first insulating layer 270 is disposed on the n-type semiconductor layer 220 between the first n-electrode 250 and the first p-electrode 260 so as to insulate the two electrodes from each other. The first insulating layer 270 completely covers the left and right side surfaces of the first n-electrode 250 as well as the left and right side surfaces of the first p-electrode 260, so that the first n-electrode 250 and the first p-electrode 260 are not electrically connected with each other. The first insulating layer 270 further partially covers the lower side of the first n-electrode 250 and defines a first opening 271, and partially covers the lower side of the first p-electrode 260 and defines at least a second opening 272. The first opening 271 and the at least second opening 272 may be cylinders extending in the vertical direction D2. The second n-electrode 280 is disposed on the first n-electrode 250 and the first insulating layer 270, and a part thereof is electrically connected with the first n-electrode 250 through the first opening 271. The second n-electrode 280 has a first area 281, and the surface area of the first area 281 is larger than that of the first joined face 251. The second p-electrode 290 is disposed on the first p-electrode 260 and the first insulating layer 270, and a part thereof is electrically connected with the first p-electrode 260 through the second opening 272. The second p-electrode 290 has a second area 291 smaller than a third area 231 of the light emitting layer 230. That is, the surface area of the second area 291 is smaller than that of the third area 231. Thus, referring to FIG. 4A again at the same time, the second n-electrode 280 and the second p-electrode 290 in this embodiment have almost the same size (same surface area) when viewed from a bottom surface, and are electrically connected and fixed to the mount substrate 10. In this way, even if the size of the light emitting layer 230 is to be enlarged so as to reduce the size of the first joined face 251, it is still possible to avoid the reduction of production efficiency caused by the need for higher welding accuracy due to size changes when electrically connecting the n-type and p-type electrodes with the mount substrate 10, and it is easier to maintain the uniformity of light emitting, but it is not limited thereto. Referring to FIG. 4B to FIG. 4C again at the same time, the second n-electrode 280 in this embodiment may also have a size smaller than or larger than that of the second p-electrode 290.

Referring to FIG. 6 again at the same time, the light emitting element 20 in this embodiment may further comprise a conductive layer 300 and a second insulating layer 310. The conductive layer 300 is disposed on the first insulating layer 270 contacting the p-type semiconductor layer 240 to have a fourth area 301 smaller than the third area 231 of the light emitting layer 230 and larger than the second areas 291 of the second p-electrode 290. The conductive layer 300 is electrically connected to the first p-electrode 260 through at least one second opening 272. Since the current density distribution affects the luminescence intensity, a plurality of second openings 272 may be uniformly dispersed on the first p-electrode 260. The second insulating layer 310 is disposed between the conductive layer 300 and the second n-electrode 280, completely covering the left side surface of the conductive layer 300, partially covering the left side surface of the second p-electrode 290 and partially covering the right side surface of the second n-electrode 280. The second p-electrode 290 is disposed on the conductive layer 300, so that the second p-electrode 290 has the second area 291 that is smaller than the second joined face 241 between the p-type semiconductor layer 240 and the first p-electrode 260. Meanwhile, the surface area of the second area 291 is smaller than the second joined face 241 between the p-type semiconductor layer 240 and the first p-electrode 260, the surface area of the second area 291 may be larger than the third joined face 261 between the first p-electrode 260 and the conductive layer 300, the surface area of the third area 231 of the light emitting layer 230 may be larger than the third joined face 261 between the first p-electrode 260 and the conductive layer 300, the second joined face 241 may be larger than the third joined face 261, the surface area of the first area 281 of the second n-electrode 280 may be larger than the third joined face 261, the surface area of the first area 281 may be smaller than the surface area of the third area 231 of the light emitting layer 230, the surface area of the first area 281 may be smaller than the second joined face 241, the fourth joined face 292 may be smaller than the second joined face 241, the fourth joined face 292 may be smaller than the surface area of the third area 231, the fourth joined face 292 between the second p-electrode 290 and the conductive layer 300 may be larger than the third joined face 261, the fifth joined face 252 between the first n-electrode 250 and the second n-electrode 280 may be smaller than the first joined face 251, the fifth joined face 252 may be smaller than the surface area of the third area 231, the fifth joined face 252 may be smaller than the second joined face 241, the fifth joined face 252 may be smaller than the third joined face 261, and the fifth joined face 252 may be smaller than the fourth joined face 292. The above arrangement may also make the second n-electrode 280 and the second p-electrode 290 have the same size as viewed from a bottom surface.

In addition, the first insulating layer 270 and/or a second insulating layer 310 may comprise a distributed Bragg reflector (DBR), i.e., it may comprise a plurality of first dielectric layers and a plurality of second dielectric layers (not shown) stacked on each other, wherein the refractive index of light in the first dielectric layers is different from the refractive index in the second dielectric layers. The greater the difference in refractive index is, the stronger the reflective light will be when the light strikes the first insulating layer 270 and/or a second dielectric layer 310, thereby increasing the luminous efficiency of the light emitting device.

Referring to FIG. 3 and FIG. 6 again at the same time, the first light transparent member 30 is disposed on the top surface 22 of at least one light emitting element 20, and may completely or partially cover the top surface 22, such as being connected and fixed to the top surface 22 by an adhesive material. The adhesive material may be a light wavelength conversion member, such as a nitride phosphor which may emit yellow or red light. The first light transparent member 30 may also be adhered to the top surface 22 of the light emitting element 20 through crystal adhesion. The first light transparent member 30 has a light-receiving surface opposite to the light-emitting surface for receiving the incident light emitted by the light emitting element 20. That is, the light emitting element 20 is optically coupled with the first light transparent member 30. The first light transparent member 30 is composed of inorganic substance and inorganic phosphor. The inorganic substance may be, for example, alumina ($Al_2O_3$), glass or ceramic, and the inorganic phosphor is not limited to phosphor of a specific color, but may be red phosphor, green phosphor or yellow phosphor, and may also be composed of phosphors of more than two different colors. Even if the inorganic phosphor is red, green or yellow phosphor of a single color, it may be composed of one or more different materials. Particularly, taking red phosphor as an example, it may comprise: CASN or SCASN series, such as $CaAlSiN_3:Eu^{2+}$, $(Sr, Ca)AlSiN_3:Eu^{2+}$, $(SrCOS:Eu^{2+}$, $CaS:Eu^{2+}$, $Sr_3Si(ON)_5:Eu^{2+}$; KSF series, such as $K_2SiF_6:Mn^{4+}$. It also comprises red phosphor with a general formula of $AE_{1-z}S_{1-y}Se_y: zA$, wherein AE is at least one alkaline earth metal selected from Mg, Ca, Sr and Ba, $0 \leq y < 1$ and $0.0005 \leq z \leq 0.2$, and A is at least one activator selected from Eu(II), Ce(III), Mn(II) and Pr(III). In addition, the green phosphor may comprise $L_2SiO_4:Eu^{2+}$ (L is an alkaline earth metal), especially $(SrBa)_2SiO_4:Eu^{2+}$ or $(SrCa)_2SiO_4:Eu^{2+}$, and it may also be $CaSc_2O_4:Ce^{2+}$, $SrGa_2S:Eu^{2+}$, $\beta$-SiAlON($Si_{6-z}Al_zO_zN_{8-z}:Eu^{2+}$) or LuAG ($Lu_3Al_5O_{12}:Ce^{2+}$) or the like. Taking yellow phosphor as an example, it may comprise TAG($Tb_3Al_5O_{12}:Ce^{3+}$), YAG ($Y_3Al_5O_{12}:Ce^{3+}$), $Sr_2SiO_4:Eu^{2+}$, $(SrBaCa)Si_2(OCl)_2N_2$:

$Eu^{2+}$. In addition, it may also comprise quantum dot phosphor and/or non-quantum dot phosphor, or BAM ($BaMgAl_{10}O_{17}$), BAM:Mn, (Zn, Cd)Zn:Cu, $Sr_5(PO_4)_3Cl$:$Eu^{2+}$, CCA, SCESN, SESN, CESN, CASBN, or phosphor expressed by general formulas of $LSi_2O_2N_2$:$Eu^{2+}$, $L_xSi_yN_{(2/3x+4/3y)}$:$Eu^{2+}$, $L_xSi_yO_zN_{(2/3x+4/3y-2/3z)}$:$Eu^{2+}$ (L is any one of Sr, Ca, Sr and Ca), which may convert the wavelength of at least a part of light from the light emitting element. The concentration of the inorganic phosphor of the first light transparent member 30 may increase from the top surface of the first light transparent member (light-emitting surface) toward the light emitting element or from the light emitting element toward the light-emitting surface. The first light transparent member 30 has a top surface 31 (light-emitting surface) and a first side surface 32 contiguous to the top surface 31. The lower surface 33 (light-receiving surface) of the first light transparent member 30 comprises a joined area 34 and a covering area 35. The joined area 34 is joined to the light emitting element 20, and the covering area 35 is covered by the covering member 80. The light emitting elements 20 are separated from each other, and include a separation area 36 which is disposed on the lower surface 33 of the first light transparent member 30 and is arranged between the joined areas 34, and the separation area 36 is covered by the covering member 80. The first light transparent member 30 and/or the second light transparent member 40 comprise a protruding area protruding outside relative to the light emitting element 20, and the covering area 35 is disposed in the protruding area of the light receiving surface, and the covering member 80 may cover the protruding area.

The second light transparent member 40 is disposed on the top surface 31 of the first light transparent member 30, completely covers the first light transparent member 30, and has an externally exposed light emission surface 41 and a second side surface 42 contiguous to the externally exposed light emission surface 41. The second light transparent member 40 is only composed of an inorganic substance and contains no inorganic phosphor.

The covering member 80 contains light reflective materials as white walls and reflective walls. For example, the covering member 80 may comprise at least one oxide in a transparent resin, and the oxide contains an element selected from the group consisting of titanium (Ti), zirconium (Zr), niobium (Nb) and aluminum (Al), and titanium (Ti), zirconium (Zr), niobium (Nb) and aluminum (Al) are used as reflective materials. The covering member 80 surrounds the periphery of the light emitting element 20, does not cover the first side surface 32 of the first light transparent member 30, and does not cover the second side surface 42 of the second light transparent member 40. The covering member 80 comprises a covering side surface 82 that is coplanar with the side surface 12 of the mount substrate 10. The manufacturing method of the light emitting device A3 may comprise: mounting the light emitting element 20 on the mount substrate 10 and electrically connecting the light emitting element 20 with the mount substrate 10; optically connecting the at least a part of the light emitting side opposite to the mounting side of the light emitting element 20 to the light transparent member; covering or surrounding the light emitting element along a thickness direction by the covering member 80, but keeping the covering member 80 at a distance from the light transparent member. The light emitting element 20 is enclosed by the first light transparent member 30 or the second light transparent member 40 in a plan view from a light emission surface side or an externally exposed light emission surface 41. In detail, referring to FIG. 1 again at the same time, as viewed from the cross section, a distance L1 exists between the left side LS1 and the right side RS1 of the first light transparent member 30 and the second light transparent member 40, a distance L2 exists between the left side LS2 of a light emitting element 20 and the right side RS2 of another light emitting element 20, and the distance L1 is larger than the distance L2.

The second light transparent member 40 may be disposed on the first light transparent member 30 by one of sintering, spray coating, screen printing, dispensing, molding, sputtering or evaporating. For example, glass powder and phosphor may be mixed and sintered into the first light transparent member 30, and then additional glass powder is sintered into the second light transparent member 40. The first light transparent member 30 and the second light transparent member 40 are bonded and then sintered again for a more stable bonding (no adhesive is needed). Finally, grinding is performed to make the first light transparent member 30 break through the process limit of separate grinding and become thinner (for example, having a thickness less than 75 μm or less than 50 μm or less than 20 μm), thereby improving the brightness of the light emitting device. Table 2 below shows the comparison results between the thickness of the first light transparent member and the average luminance of the light emitting device installed with the light transparent member.

TABLE 2

| First light transparent member (Size: Width 1.090 × Length 1.090 μm) | | | | | |
|---|---|---|---|---|---|
| Thickness (H) | 200 μm | 150 μm | 100 μm | 75 μm | 50 μm |
| Avg. Luminous (1 m) @ 700 mA | 271 (0%) | 277 (+2.21%) | 285 (+5.17%) | 300 (+10.7%) | 304 (+12.18%) |

When the second light transparent member 40 is made of inorganic materials, silicon dioxide or other inorganic materials may also preferably be sprayed or evaporated onto the first light transparent member 30, so that the first light transparent member 30 and the second light transparent member 40 are firmly bonded without adhesive, thereby improving the reliability of the LED chip. The second light transparent member 40 may be made of transparent adhesive, such as epoxy resin or silicone. In addition, the second light transparent member 40 may further comprise a light diffusion agent (as shown in FIG. 15) to increase the luminous efficiency of the light emitting device and improve the light uniformity.

The light emitting device A3 may further comprise at least one gap 90 disposed between the first side surface 32 of the first light transparent member 30, the second side surface 42 of the second light transparent member 40 and the covering member 80. Further speaking, the covering member 80 is disposed on the surface 11 of the mount substrate 10, surrounds and covers the light emitting element 20, and comprises a groove 44 extending toward the mount substrate 10 along the vertical direction D2. The top surface 81 of the covering member 80 and the externally exposed light emission surface 41 of the second transparent member 40 may be located in the same plane, and the groove 44 defines an inner side surface 441, which is separated from the coplanar first side surface 32 and the second side surface 42 by a distance L5.

Further speaking, the first and second light transparent members 30 and 40 are arranged in the groove 44, contacting the top surface 22 of the light emitting element 20 and not filling the groove 44 up, thereby forming a gap 90. That is, at least one outer side surface parallel to the vertical direction of the first and second light transparent members 30 and 40 is separated from at least one corresponding inner side surface 441 parallel to the vertical direction of the groove 44 by a distance L5, so that when the ambient temperature increases, the first and second light transparent members 30 and 40 will not be pressed against the covering member 80 and thus get damaged or peeled off during the process of expansion due to the difference in expansion coefficients from the covering member 80. Alternatively, it is also possible that only an outer side surface of the first light transparent member 30 and the second light transparent member 40 is separated from an inner side surface 441 of the corresponding groove 44 by a distance L5 (only one side of the rectangle has a gap), which may also improve the durability.

Figure 16:
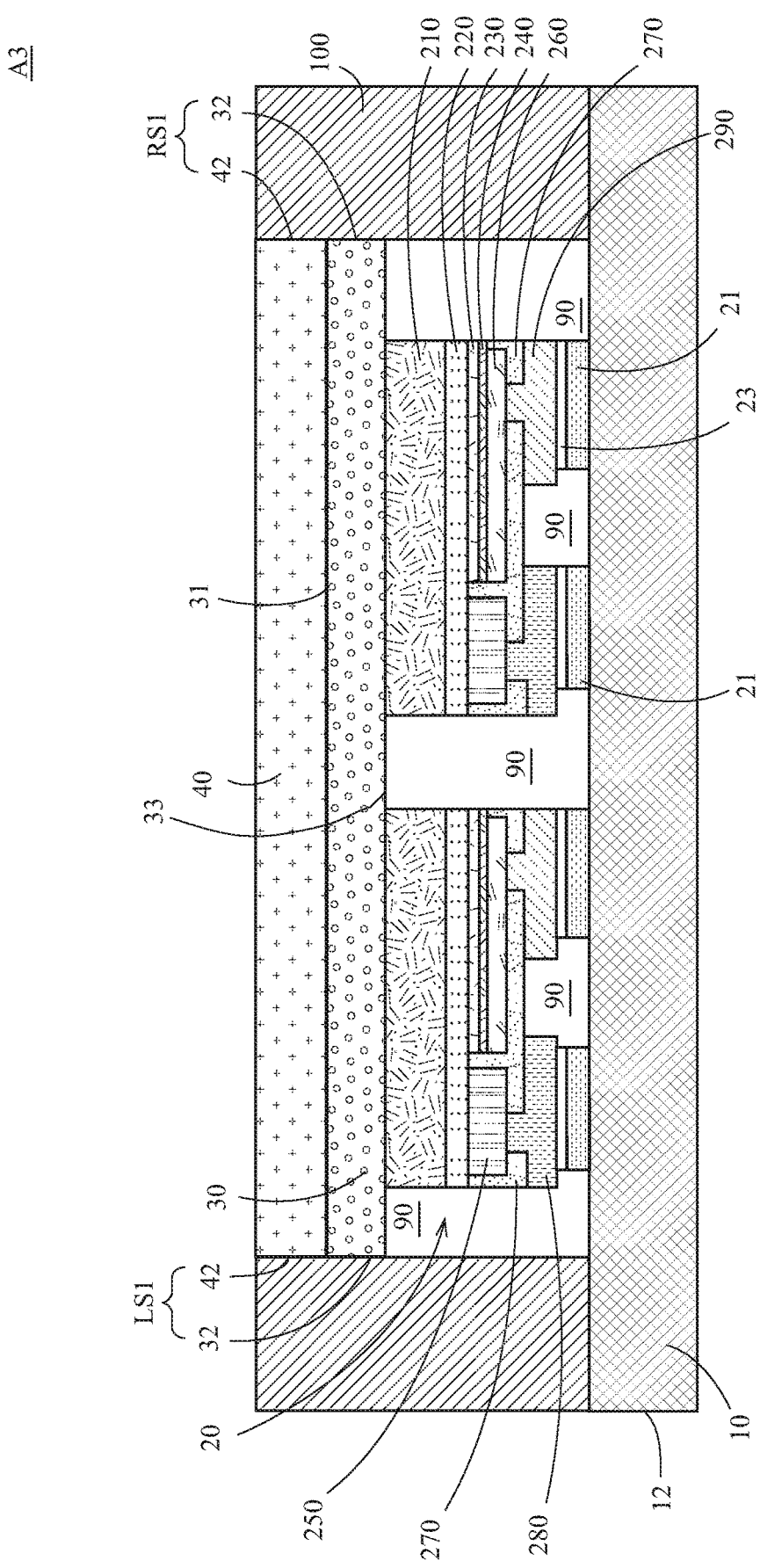
Figure 17:
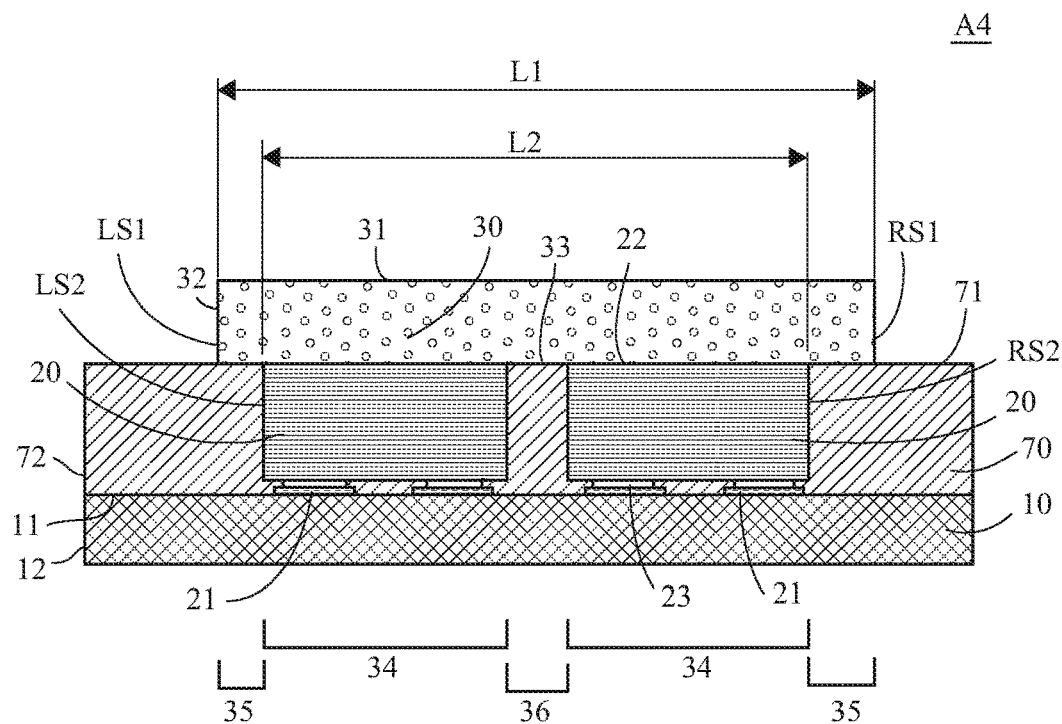
FIG. 17 to FIG. 22 are different schematic cross-sectional views of a light emitting device according to a fourth preferred embodiment of the present invention.

Referring to FIG. 16, the at least one gap 90 may also be disposed between the lower surface 33 of the first light transparent member 30, the light emitting element 20 and the covering member 100, that is, a hollow portion is formed between the light emitting element 20 and the covering member 100 and/or between the plurality of the light emitting elements 20.

Please continue to refer to FIG. 17 to FIG. 22, which are schematic cross-sectional views of a light emitting device A4 according to a fourth preferred embodiment of the present invention.

The light emitting device A4 may be used as a part of a backlight module, a light-emitting module, and a vehicle head lamp module. As the vehicle head lamp module, the light emitting device may include headlight lens and lens. It may comprise a mount substrate 10, at least one light emitting element 20, a first light transparent member 30 and a covering member 70. The light emitting device A1 may be a single-chip package light emitting device or a multi-chip package light emitting device. The technical contents of the components are described in sequence as follows.

The mount substrate 10 may be a circuit board or a ceramic substrate, which defines a horizontal direction D1 and a vertical direction D2 which are perpendicular to each other, and has a surface 11. At least one light emitting element 20 may be an LED chip disposed in a flip-chip manner, and the LED chip may comprise rhodium as an electrode contact layer, and it is disposed on the surface 11 of the mount substrate 10, and is electrically connected with the electrode 21 of the circuit board or the ceramic substrate through a plurality of conductive elements 23 (e.g., solders including tin, silver-tin alloy and/or gold-tin alloy). A schematic cross-sectional view of the light emitting device is shown in the following drawings, in which two light emitting elements 20 can be seen, without being limited thereto.

The light emitting device 20 may be a flip-chip LED chip, which is separately arranged on the surface 11 of the mount substrate 10 along the horizontal direction D1. The light emitting device 20 may be rectangular and comprises a top surface 22. Please refer to FIG. 3 again at the same time, each light emitting device 20 in this embodiment may comprise a light-transmitting element substrate 210, an n-type semiconductor layer 220, a light emitting layer 230, a p-type semiconductor layer 240, a first n-electrode 250, a first p-electrode 260, a first insulating layer 270, a second n-electrode 280 and a second p-electrode 290.

The light-transmitting element substrate 210 may comprise sapphire, ceramic, resin, thermosetting epoxy resin (EMC). The light-transmitting element substrate 210 comprises a surface 211. The n-type semiconductor layer 220 is disposed on the surface 211 and connected to the light-transmitting element substrate 210. A light emitting layer 230 is disposed on the n-type semiconductor layer 220. The p-type semiconductor layer 240 is disposed on the light emitting layer 230, the light emitting layer 230 and the p-type semiconductor layer 240 expose an area 212 of the n-type semiconductor layer 220, which is an area uncovered by the light emitting layer 230 and the p-type semiconductor layer 240, and the p-type semiconductor layer 240 contacts with the n-type semiconductor layer to form a light emitting layer 230. The first n-electrode 250 is disposed on the area 212 of the n-type semiconductor layer 220, is not connected with the p-type semiconductor layer 240, and makes contact with the n-type semiconductor layer 220 to form a first joined face 251. The first p-electrode 260 is disposed on the p-type semiconductor layer 240. The first n-electrode 250 and the first p-electrode 260 may be respectively indium tin oxide (ITO) and indium zinc oxide (IZO).

The first insulating layer 270 is disposed on the n-type semiconductor layer 220 between the first n-electrode 250 and the first p-electrode 260 so as to insulate the two electrodes from each other. The first insulating layer 270 completely covers the left and right side surfaces of the first n-electrode 250 as well as the left and right side surfaces of the first p-electrode 260, so that the first n-electrode 250 and the first p-electrode 260 are not electrically connected with each other. The first insulating layer 270 further partially covers the lower side of the first n-electrode 250 and defines a first opening 271, and partially covers the lower side of the first p-electrode 260 and defines at least a second opening 272. The first opening 271 and the at least second opening 272 may be cylinders extending in the vertical direction D2. The second n-electrode 280 is disposed on the first n-electrode 250 and the first insulating layer 270, and a part thereof is electrically connected with the first n-electrode 250 through the first opening 271. The second n-electrode 280 has a first area 281, and the surface area of the first area 281 is larger than that of the first joined face 251. The second p-electrode 290 is disposed on the first p-electrode 260 and the first insulating layer 270, and a part thereof is electrically connected with the first p-electrode 260 through the second opening 272. The second p-electrode 290 has a second area 291 smaller than a third area 231 of the light emitting layer 230. That is, the surface area of the second area 291 is smaller than that of the third area 231. Thus, referring to FIG. 4A again at the same time, the second n-electrode 280 and the second p-electrode 290 in this embodiment have almost the same size (same surface area) when viewed from a bottom surface, and are electrically connected and fixed to the mount substrate 10. In this way, even if the size of the light emitting layer 230 is to be enlarged so as to reduce the size of the first joined face 251, it is still possible to avoid the reduction of production efficiency caused by the need for higher welding accuracy due to size changes when electrically connecting the n-type and p-type electrodes with the mount substrate 10, and it is easier to maintain the uniformity of light emitting, but it is not limited thereto. Referring to FIG. 4B to FIG. 4C again at the same time, the second n-electrode 280 in this embodiment may also have a size smaller than or larger than that of the second p-electrode 290.

Referring to FIG. 6 again at the same time, the light emitting element 20 in this embodiment may further comprise a conductive layer 300 and a second insulating layer 310. The conductive layer 300 is disposed on the first insulating layer 270 contacting the p-type semiconductor layer 240 to have a fourth area 301 smaller than the third area 231 of the light emitting layer 230 and larger than the second areas 291 of the second p-electrode 290. The conductive layer 300 is electrically connected to the first p-electrode 260 through at least one second opening 272, and a plurality of second openings 272 may be uniformly dispersed on the first p-electrode 260. The second insulating layer 310 is disposed between the conductive layer 300 and the second n-electrode 280, completely covering the left side surface of the conductive layer 300, partially covering the left side surface of the second p-electrode 290 and partially covering the right side surface of the second n-electrode 280. The second p-electrode 290 is disposed on the conductive layer 300, so that the second p-electrode 290 has the second area 291 that is smaller than the second joined face 241 between the p-type semiconductor layer 240 and the first p-electrode 260. Meanwhile, the surface area of the second area 291 is smaller than the second joined face 241 between the p-type semiconductor layer 240 and the first p-electrode 260, the surface area of the second area 291 may be larger than the third joined face 261 between the first p-electrode 260 and the conductive layer 300, the surface area of the third area 231 of the light emitting layer 230 may be larger than the third joined face 261 between the first p-electrode 260 and the conductive layer 300, the second joined face 241 may be larger than the third joined face 261, the surface area of the first area 281 of the second n-electrode 280 may be larger than the third joined face 261, the surface area of the first area 281 may be smaller than the surface area of the third area 231 of the light emitting layer 230, the surface area of the first area 281 may be smaller than the second joined face 241, the fourth joined face 292 may be smaller than the second joined face 241, the fourth joined face 292 may be smaller than the surface area of the third area 231, the fourth joined face 292 between the second p-electrode 290 and the conductive layer 300 may be larger than the third joined face 261, the fifth joined face 252 between the first n-electrode 250 and the second n-electrode 280 may be smaller than the first joined face 251, the fifth joined face 252 may be smaller than the surface area of the third area 231, the fifth joined face 252 may be smaller than the second joined face 241, the fifth joined face 252 may be smaller than the third joined face 261, and the fifth joined face 252 may be smaller than the fourth joined face 292. The above arrangement may also make the second n-electrode 280 and the second p-electrode 290 have the same size as viewed from a bottom surface.

In addition, the first insulating layer 270 and/or the second insulating layer 310 may comprise a distributed Bragg reflector (DBR), i.e., it may comprise a plurality of first dielectric layers and a plurality of second dielectric layers (not shown) stacked on each other, wherein the refractive index of light in the first dielectric layers is different from the refractive index in the second dielectric layers. The greater the difference in refractive index is, the stronger the reflective light will be when the light strikes the first insulating layer 270 and/or the second dielectric layer 310, thereby increasing the luminous efficiency of the light emitting device.

Referring to FIG. 3 and FIG. 6 again at the same time, the first light transparent member 30 in this embodiment is disposed on the top surface 22 of at least one light emitting element 20, and may completely or partially cover the top surface 22, such as being connected and fixed to the top surface 22 by an adhesive material. The adhesive material may be a light wavelength conversion member, such as a nitride phosphor which may emit yellow or red light. The first light transparent member 30 may also be adhered to the top surface 22 of the light emitting element 20 through crystal adhesion. The first light transparent member 30 has a light-receiving surface opposite to the light-emitting surface for receiving the incident light emitted by the light emitting element 20. That is, the light emitting element 20 is optically coupled with the first light transparent member 30. The first light transparent member 30 is composed of inorganic substance and inorganic phosphor. The inorganic substance may be, for example, alumina ($Al_2O_3$), glass or ceramic, and the inorganic phosphor is not limited to phosphor of a specific color, but may be red phosphor, green phosphor or yellow phosphor, and may also be composed of phosphors of more than two different colors. Even if the inorganic phosphor is red, green or yellow phosphor of a single color, it may be composed of one or more different materials. Particularly, taking red phosphor as an example, it may comprise: CASN or SCASN series, such as $CaAlSiN_3:Eu^{2+}$, $(Sr, Ca)AlSiN_3:Eu^{2+}$, $(SrCa)S:Eu^{2+}$, $CaS:Eu^{2+}$, $Sr_3Si(ON)_5:Eu^{2+}$; KSF series, such as $K_2SiF_6:Mn^{4+}$. It also comprises red phosphor with a general formula of $AE_{1-z}S_{1-y}Se_y: zA$, wherein AE is at least one alkaline earth metal selected from Mg, Ca, Sr and Ba, $0 \leq y < 1$ and $0.0005 \leq z \leq 0.2$, and A is at least one activator selected from Eu(II), Ce(III), Mn(II) and Pr(III). In addition, the green phosphor may comprise $L_2SiO_4:Eu^{2+}$ (L is an alkaline earth metal), especially $(SrBa)_2SiO_4:Eu^{2+}$ or $(SrCa)_2SiO_4:Eu^{2+}$, and it may also be $CaSc_2O_4:Ce^{2+}$, $SrGa_2S:Eu^{2+}$, β-SiAlON $(Si_{6-z}Al_zO_zN_{8-z}:Eu^{2+})$ or $LuAG(Lu_3Al_5O_{12}:Ce^{2+})$ or the like. Taking yellow phosphor as an example, it may comprise $TAG(Tb_3Al_5O_{12}:Ce^{3+})$, $YAG(Y_3Al_5O_{12}:Ce^{3+})$, $Sr_2SiO_4:Eu^{2+}$, $(SrBaCa)Si_2(OCl)_2N_2:Eu^{2+}$. In addition, it may also comprise quantum dot phosphor and/or non-quantum dot phosphor, or $BAM(BaMgAl_{10}O_{17})$, BAM:Mn, (Zn, Cd)Zn:Cu, $Sr_5(PO_4)_3Cl:Eu^{2+}$, CCA, SCESN, SESN, CESN, CASBN, or phosphor expressed by general formulas of $LSi_2O_2N_2:Eu^{2+}$, $L_xSi_yN_{(2/3x+4/3y)}:Eu^{2+}$, $L_xSi_yO_zN_{(2/3x+4/3y-2/3z)}:Eu^{2+}$ (L is any one of Sr, Ca, Sr and Ca), which may convert the wavelength of at least a part of light from the light emitting element. The concentration of the inorganic phosphor of the first light transparent member 30 may increase from the top surface 31 of the first light transparent member 30 (light-emitting surface) toward the light emitting element or from the light emitting element toward the light-emitting surface. The first light transparent member 30 has a top surface 31 (light-emitting surface) and a first side surface 32 contiguous to the top surface 31. Referring to FIG. 5 again at the same time, the lower surface 33 (light-receiving surface) of the first light transparent member 30 comprises a joined area 34 and a covering area 35. The joined area 34 is joined to the light emitting element 20, and the covering area 35 is covered or contacted by the covering member 70. The light emitting elements 20 are separated from each other, and include a separation area 36 which is disposed on the lower surface 33 of the first light transparent member 30 and is arranged between the joined areas 34, and the separation area 36 is covered by the covering member 70. The first light transparent member 30 comprises a protruding area protruding outside relative to the light emitting element 20, and the covering area 34 is disposed in the protruding area of the light receiving surface, and the covering member 70 may cover or contact the protruding area.

The covering member 70 contains light reflective materials as white walls and reflective walls. For example, the covering member 70 may comprise at least one oxide in a transparent resin, and the oxide contains an element selected from the group consisting of titanium (Ti), zirconium (Zr), niobium (Nb) and aluminum (Al). The covering member 70 surrounds the periphery of the light emitting element 20 and comprises a covering side surface 72 that is coplanar with the side surface 12 of the mount substrate 10.

The manufacturing method of the light emitting device A4 may comprise: mounting the light emitting element 20 on the mount substrate 10 and electrically connecting the light emitting element 20 with the mount substrate 10; optically connecting the at least a part of the light emitting side opposite to the mounting side of the light emitting element 20 to the first light transparent member 30; and covering or surrounding the light emitting element 20 along a thickness direction by the covering member 70. The light emitting element 20 is enclosed by the first light transparent member 30 in a plan view from a light emission surface side or an externally exposed light emission surface 41. In detail, referring to FIG. 17, FIG. 20, FIG. 21 and FIG. 22, as viewed from a cross section, a distance L1 exists between the opposite left and right sides (shown as LS1 and LS2 in the figure) of the first side surface 32 of the first light transparent member 30, a distance L2 exists between the left side LS2 of a light emitting element 20 and the right side RS2 of another light emitting element 20, and the distance L1 is larger than the distance L2.

Figure 18:
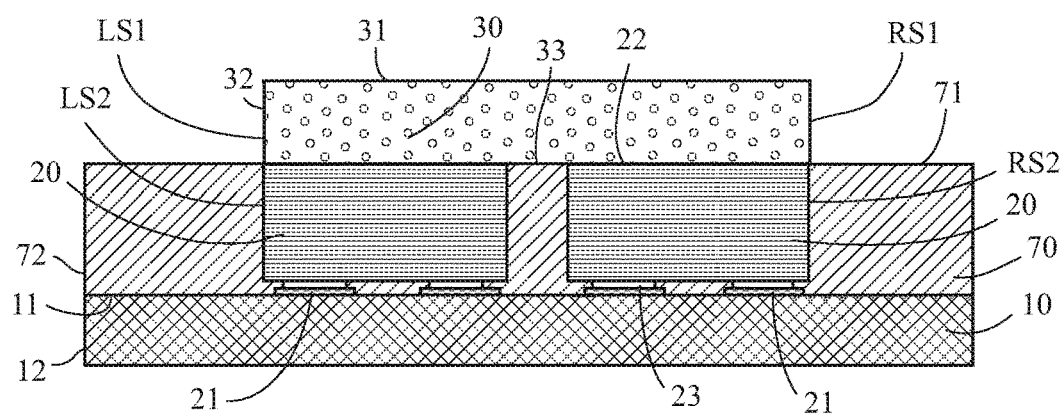
Figure 19:
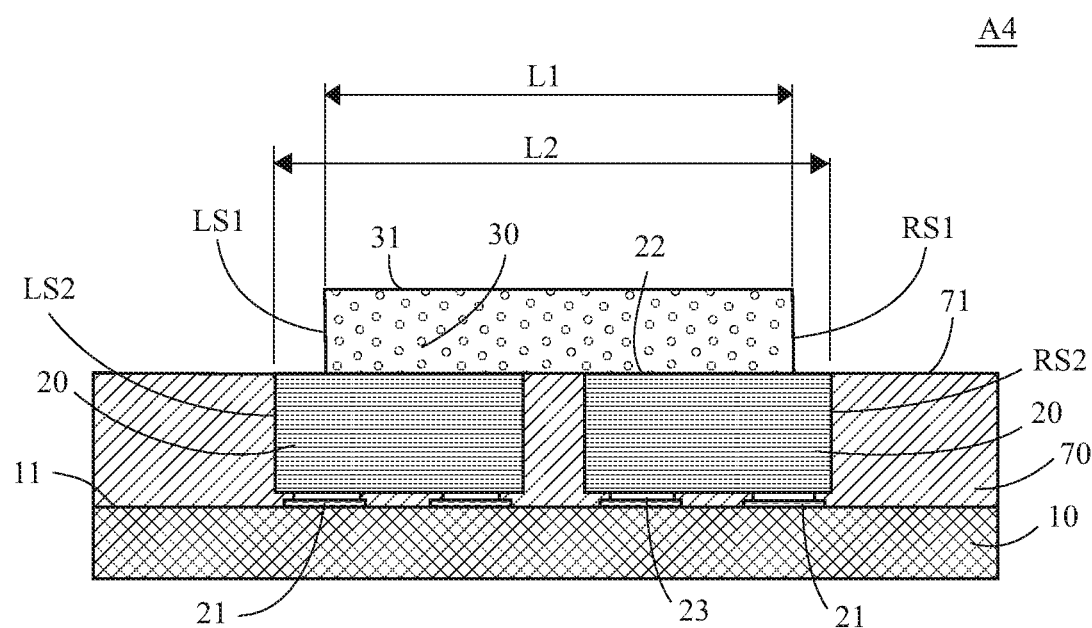
Figure 20:
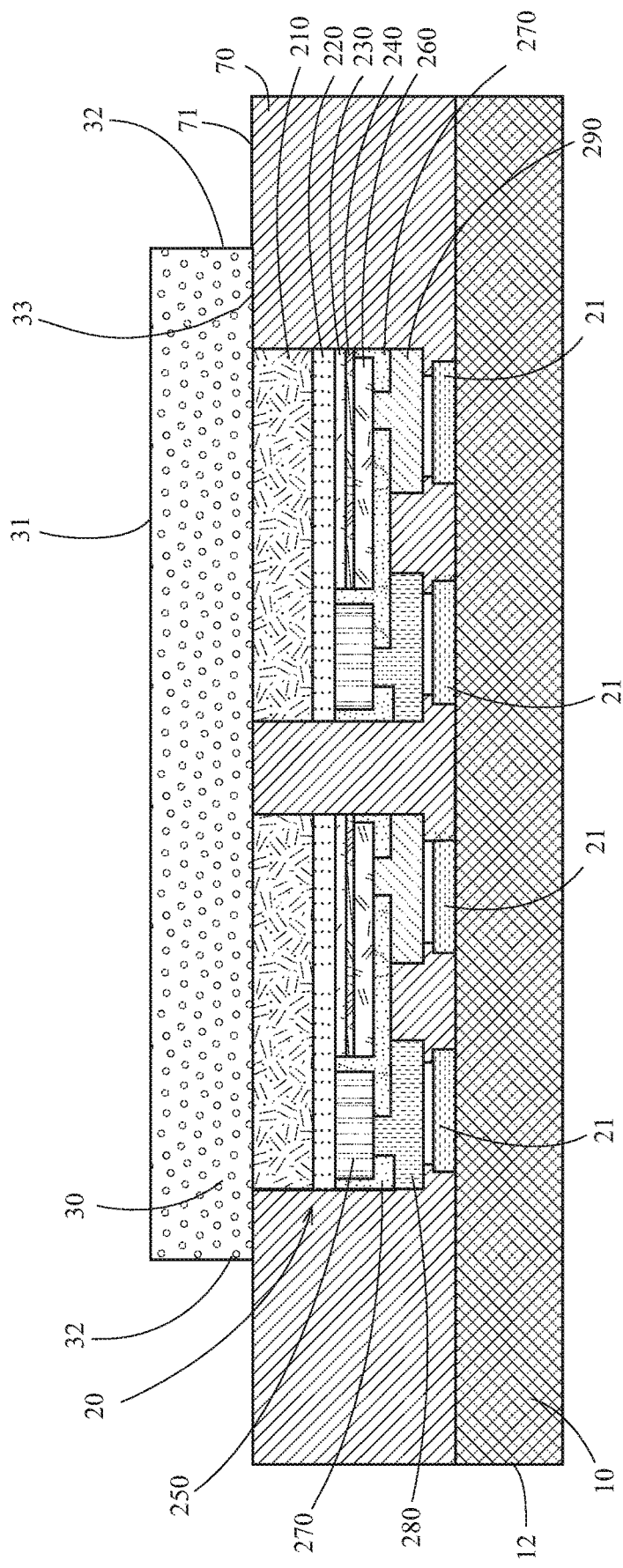

Alternatively, the light emitting element 20 is not enclosed by the first light transparent member 30 in a plan view from an externally exposed light emission surface side. In other words, the first side surface 32 of the first light transparent member 30 is located within the top surface 22 of the light emitting element 20. In detail, as viewed from the cross section, the distance L1 may be equal to the distance L2 (as shown in FIG. 18), or the distance L1 is smaller than the distance L2 (as shown in FIG. 19).

Figure 21:
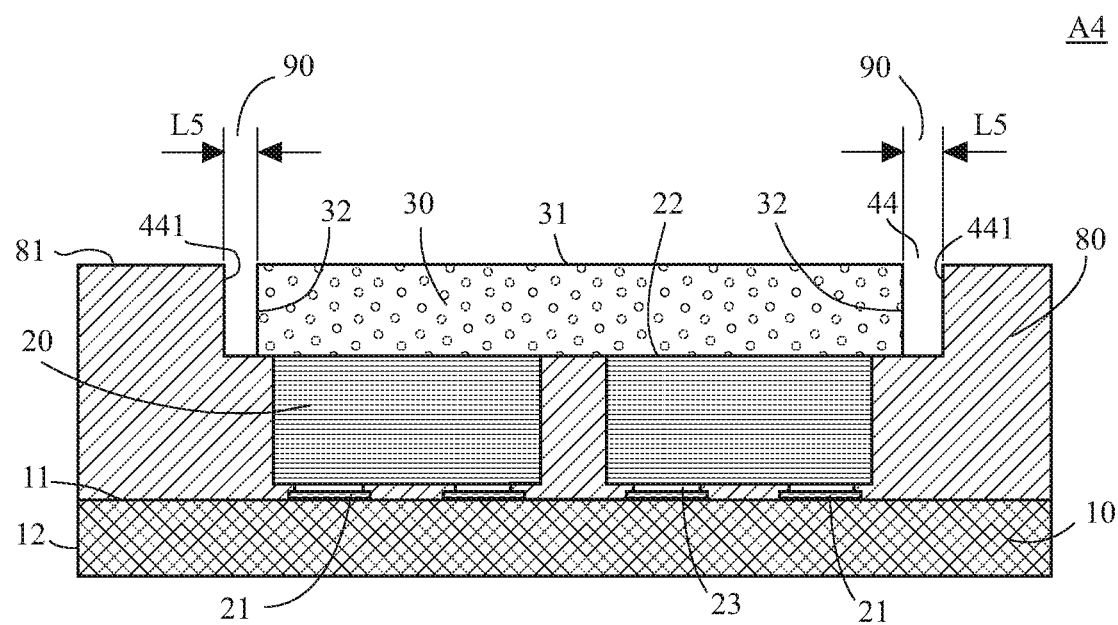

The top surface 31 of the first light transparent member 30 of the light emitting device A4 is not coplanar with the top surface 71 of the covering member 70 (as shown in FIG. 17 to FIG. 20), and the lower surface 33 of the first light transparent member 30 is coplanar with the top surface 71 of the covering member 70, thus exposing the first side surface 32 of the first light transparent member 30. As shown in FIG. 21, the light emitting device A4 may also comprise at least one gap 90 disposed between the first side surface 32 of the first light transparent member 30 and the covering member 80. Further speaking, the covering member 80 is disposed on the surface 11 of the mount substrate 10, surrounds and covers the light emitting element 20, and comprises a groove 44 extending toward the mount substrate 10 along the vertical direction D2. The top surface 81 of the covering member 80 and a top surface 31 of the first light transparent member 30 (light-emitting surface) may be located in the same plane, and the groove 44 defines an inner side surface 441, which is separated from the coplanar first side surface 32 by a distance L5.

Further speaking, the first light transparent member 30 is arranged in the groove 44, contacting the top surface 22 of the light emitting element 20 and not filling the groove 44 up, thereby forming a gap 90. That is, at least one outer side surface parallel to the vertical direction of the first light transparent member 30 is separated from at least one corresponding inner side surface 441 parallel to the vertical direction of the groove 44 by a distance L5. In this way, when the ambient temperature increases, the first light transparent member 30 in the light emitting device A4 will not be pressed against the expanded covering member 80 and thus get damaged or peeled off. Alternatively, it is also possible that only an outer side surface of the first light transparent member 30 (one side of the rectangle) is separated from an inner side surface 441 of the corresponding groove 44 by a distance L5, which may also improve the durability.

Figure 22:
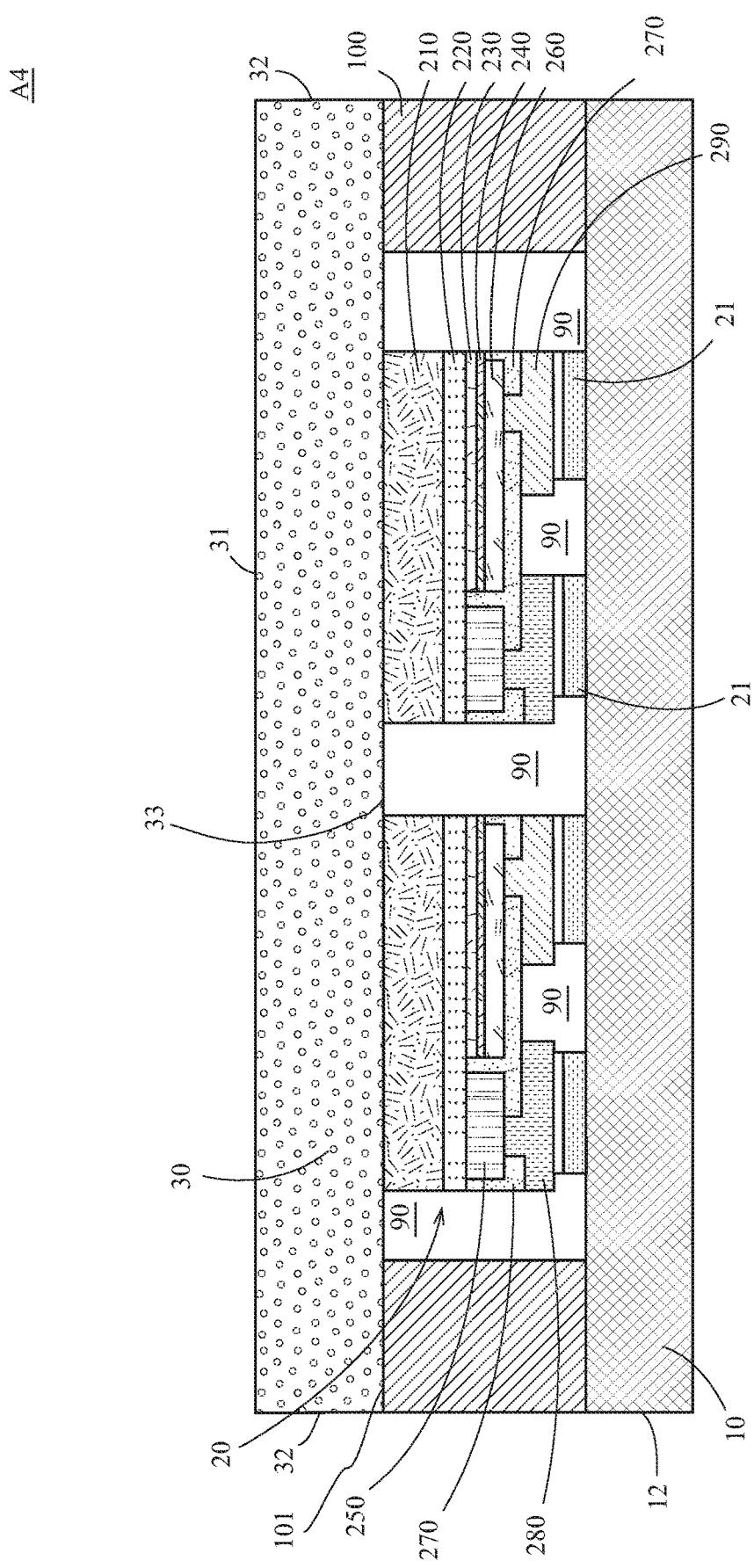

Referring to FIG. 22, the at least one gap 90 may also be disposed between the lower surface 33 of the first light transparent member 30, the light emitting element 20 and the covering member 100. That is, the covering member 100 does not make contact with the light emitting element 20, the top surface 101 contacts the lower surface 33 of the first light transparent member 30, and a hollow portion is formed between the first light transparent member 30, the light emitting element 20 and the covering member 100.

In the above embodiments, the LED may be a nitride semiconductor with a general formula of $In_xAl_yGa_{1-x-y}N$ ($0 \leq x$, $0 \leq y$, $x+y \leq 1$), and B or P and As may be used as mixed crystals. In addition, the n-type semiconductor layer and the p-type semiconductor layer are not particularly limited to be a single layer or a plurality of layers. For the light emitting layer of which the nitride semiconductor layer has an active layer, the active layer thereof is used as a single quantum well structure (SQW) or a multiple quantum well structure (MQW). Hereinafter, an example of a nitride semiconductor layer is shown. It is used on a growth substrate, the substrate layer of nitride semiconductor such as buffer layer, e.g., a low-temperature growth thin film GaN and InGaN layer, is used as the n-type nitride semiconductor layer. For example, n-type contact layer of Si-doped GaN and n-type multilayer film of GaN/InGaN are laminated, and then the active layer of InGaN/GaN MQW is laminated. Further speaking, as the p-type nitride semiconductor layer, for example, a structure in which a p-type multilayer film of Mg-doped InGaN/AlGaN and a p-type contact layer of Mg-doped GaN are laminated is used. In addition, the light emitting layer (active layer) of the nitride semiconductor has a well layer, and a quantum well structure including a barrier layer and a well layer, for example. The nitride semiconductor used for the active layer may also be doped with p-type impurities, but by being undoped or doped with n-type impurities, the light emitting element may be used as a high-output device. By including Al in the well layer, a wavelength shorter than the wavelength 365 nm of the band gap energy of GaN may be obtained. The wavelength of light emitted from the active layer is around 360 nm to 650 nm, preferably 380 nm to 560 nm, depending on the purpose and use or the like of the light emitting element. The composition of the well layer is InGaN, which is best used in visible light and near ultraviolet range, and in this case, the composition of the barrier layer is preferably GaN and InGaN. Specific examples of the film thicknesses of the barrier layer and the well layer are 1 nm to 30 nm and 1 nm to 20 nm respectively, which may be used as a single quantum well with one well layer, a multiple quantum well structure with multiple well layers and a barrier layer or the like.

In an embodiment, the light transparent member may be made of the same material as the covering member, e.g., resin, glass, inorganic substance may be used. Furthermore, the light transparent member may also be a molded body or crystalline formed with phosphor. In addition, in the case where the light transparent member is plate-shaped, both the light-emitting surface and the light-receiving surface are slightly flat surfaces, and more preferably, the two opposite surfaces are parallel to each other, so that light travels optimally from the light-receiving surface to the light-emitting surface. On the other hand, the light-emitting surface and the light-receiving surface are not limited to flat surfaces, and other planar shapes such as concave-convex surfaces in which a part of instead of all the surfaces has a curved surface are possible, and further speaking, the surfaces are not limited to planar shapes, but may be used as various shapes or forms, such as shapes for collecting and dispersing light, e.g., optical shapes such as a lens shape. Specifically, the light transparent member provided with phosphor is composed of a glass plate, a structure provided with the light transparent member, a phosphor crystal of the light transparent member or a single crystal, polycrystal or amorphous body having its phase, or a sintered body, an aggregate or a porous material of the phosphor crystalline particles and the appropriately added light transparent member, which is mixed with and impregnated with a light transparent member such as a resin, or a light transparent member containing phosphor particles, e.g., a molded body of the light transparent resin or the like. However, the light transparent member is better in terms of heat resistance since it is formed by adding inorganic materials as compared to organic materials such as resin or the like.

In the above embodiments, the light reflective material in the covering member is an oxide selected from the group consisting of Ti, Zr, Nb, Al and Si, or at least one of AlN and MgF, and it is specifically at least one selected from the group consisting of $TiO_2$, $ZrO_2$, $Nb_2O_5$, $Al_2O_3$, MgF, AlN and $SiO_2$. In the covering member, especially for the light reflective material contained in the light transparent resin, especially the particles for providing light transmittance, it is desirable to use an oxide selected from the group consisting of Ti, Zr, Nb and Al to improve the light transmittance and reflectance of the material and the refractive index difference with the substrate. In addition, the covering member may also be formed by a molded body made of the above-mentioned light reflective material, specifically, it may also be used as a porous material of an aggregate and a sintered body in which the above-mentioned particles are agglomerated, or other molded bodies made by sol and gel methods. In such a covering member made of porous material, the refractive index difference between the aforesaid light reflective material and the air of the porous material may be increased, which is ideal because of improving the light reflectivity. On the other hand, when comparing a covering member made of porous material with a covering member made of a base material such as the above resin, there are different tendencies in forming into a desired shape and additionally improving sealing performance and airtightness. In the case of a light emitting device made of either or both of the above covering members, the covering member made of the above base material is preferable. In addition, considering the characteristics of the covering members formed of the above two kinds of materials, it is also possible to form a composite molded body of the two kinds of materials. For example, in a covering member formed into a desired shape, resin is impregnated from the outer surface side as a member impregnated with resin from the outer surface side thereof to a part in the depth direction, thereby sealing the light emitting element to improve airtightness. In the inner surface side of the light emitting element side, it is also possible to form a molded body that realizes high reflection performance through porosity. In this way, the covering member or the surrounding body formed therefrom is not necessarily completely sealed, and it may be hermetically sealed, and at the same time, it may be used for communication between the internal range and the outside, and it may be gas permeable, for example, in a form that at least no light leaks out, especially in a form with no leakage in the emission direction.

According to the above descriptions, the light transparent member of the light emitting device of the present invention has at least the following combinations and characteristics, which may be applied to the above technical features:

1. Both the first and second light transparent members are made of inorganic substances, and only the first light transparent member contains phosphor.
2. The first transparent member is made of an inorganic substance and contains phosphor, and the second transparent member is made of an organic substance.
3. The first transparent member is a phosphor in glass, and the second transparent member is a transparent film or a glass patch.
4. Only the first light transparent member is provided, and no second light transparent member is provided, and the first light transparent member is not covered by the covering member.
5. There is at least one gap or hollow portion between the light transparent member(s) (the first light transparent member and/or the second light transparent member), the light emitting element(s) and the covering member.

In this way, the light emitting device of the present invention can reduce or avoid the deterioration of the fluorescent layer in high temperature, high humidity and/or sulfur-containing gas, break through the process limit to effectively improve the luminous efficiency, or it can prevent the light transparent member from being pressed and damaged due to the thermal expansion of the covering member in the high temperature environment, thereby improving the reliability of the light emitting device while controlling the cost.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:
1. A light emitting device, comprising:
a mount substrate;
at least one light emitting element disposed on the mount substrate in a flip-chip manner,
wherein the light emitting element comprises:
a light-transmitting element substrate;
an n-type semiconductor layer disposed on the light-transmitting element substrate;
a light emitting layer disposed on the n-type semiconductor layer;
a p-type semiconductor layer disposed on the light emitting layer, wherein the light emitting layer and the p-type semiconductor layer expose an area of the n-type semiconductor layer;
a first n-electrode disposed on the area of the n-type semiconductor layer;
a first p-electrode disposed on the p-type semiconductor layer;
a first insulating layer disposed on the n-type semiconductor layer so as to insulate the first n-electrode and the first p-electrode from each other;
a second n-electrode disposed on the first n-electrode and the first insulating layer, wherein the second n-electrode has a first area larger than a first joined face between the n-type semiconductor layer and the first n-electrode so that the second n-electrode is electrically connected to the first n-electrode, wherein the second n-electrode is insulated from the first p-electrode by the first insulating layer; and a second p-electrode disposed on the first p-electrode and the first insulating layer, wherein the second p-electrode has a second area smaller than a third area of the light emitting layer, wherein the second p-electrode is electrically connected to the first p-electrode, wherein the second n-electrode and the second p-electrode have virtually same size and are electrically connected and fixed to the mount substrate;

a first light transparent member that receives incident light emitted from the at least one light emitting element, wherein the first light transparent member is formed of an inorganic substance and an inorganic phosphor, and the first light transparent member has a top surface and a first side surface contiguous to the top surface;

a second light transparent member disposed on the top surface of the first light transparent member, wherein the second light transparent member is only formed of the inorganic substance and contains no the inorganic phosphor, and the second light transparent member has an externally exposed light emission surface and a second side surface contiguous to the externally exposed light emission surface; and a covering member comprising a light reflective material, and covering at least the first side surface of the first light transparent member and at least the second side surface of the second light transparent member;

wherein the light emitting element is not enclosed by the first light transparent member and not enclosed by the second light transparent member in a plan view from the externally exposed light emission surface side, wherein the first side surface of the first light transparent member and the second side surface of the second light transparent member are located inside a top surface of the light emitting element.

2. The light emitting device according to claim 1, wherein the light emitting element is enclosed by the first light transparent member or the second light transparent member in a plan view from the externally exposed light emission surface.

3. The light emitting device according to claim 1, wherein the light emitting element is not enclosed by the first light transparent member or the second light transparent member in a plan view from the externally exposed light emission surface side, wherein the first side surface of the first light transparent member and the second side surface of the second light transparent member are located inside a top surface of the light emitting element.

4. The light emitting device according to claim 1, wherein the first insulating layer has at least one first opening and at least one second opening, and the second n-electrode is electrically connected to the first n-electrode through the at least one first opening of the first insulating layer, and the second p-electrode is electrically connected to the first p-electrode through the at least one second opening of the first insulating layer.

5. A light emitting device, comprising:
a mount substrate;
at least one light emitting element disposed on the mount substrate in a flip-chip manner,
wherein the light emitting element comprises:
a light-transmitting element substrate;
an n-type semiconductor layer disposed on the light-transmitting element substrate;
a light emitting layer disposed on the n-type semiconductor layer;
a p-type semiconductor layer disposed on the light emitting layer, wherein the light emitting layer and the p-type semiconductor layer expose an area of the n-type semiconductor layer;
a first n-electrode disposed on the area of the n-type semiconductor layer;
a first p-electrode disposed on the p-type semiconductor layer;
a first insulating layer disposed on the n-type semiconductor layer so as to insulate the first n-electrode and the first p-electrode from each other;
a second n-electrode disposed on the first n-electrode and the first insulating layer, wherein the second n-electrode has a first area larger than a first joined face between the n-type semiconductor layer and the first n-electrode so that the second n-electrode is electrically connected to the first n-electrode, wherein the second n-electrode is insulated from the first p-electrode by the first insulating layer;
a second p-electrode disposed on the first p-electrode and the first insulating layer, wherein the second p-electrode has a second area smaller than a third area of the light emitting layer, wherein the second p-electrode is electrically connected to the first p-electrode, wherein the second n-electrode and the second p-electrode have virtually same size and are electrically connected and fixed to the mount substrate;

wherein the first insulating layer has at least one first opening and at least one second opening, and the second n-electrode is electrically connected to the first n-electrode through the at least one first opening of the first insulating layer, and the second p-electrode is electrically connected to the first p-electrode through the at least one second opening of the first insulating layer;

a conductive layer disposed on the first insulating layer on the p-type semiconductor layer, wherein the conductive layer comprises a fourth area which is smaller than the third area of the light emitting layer and is larger than the second area of the second p-electrode, the conductive layer being electrically connected to the first p-electrode through at least one second opening; and a second insulating layer disposed between the conductive layer and the second n-electrode so as to insulate the conductive layer and the second n-electrode from each other;

wherein the second p-electrode is disposed on the conductive layer, the second p-electrode has the second area that is smaller than a second joined face between the p-type semiconductor layer and the first p-electrode and the second p-electrode is electrically connected to the first p-electrode through the conductive layer;

a first light transparent member that receives incident light emitted from the at least one light emitting element, wherein the first light transparent member is formed of an inorganic substance and an inorganic phosphor, and the first light transparent member has a top surface and a first side surface contiguous to the top surface;

a second light transparent member disposed on the top surface of the first light transparent member, wherein the second light transparent member is only formed of the inorganic substance and contains no the inorganic phosphor, and the second light transparent member has an externally exposed light emission surface and a second side surface contiguous to the externally exposed light emission surface; and a covering member comprising a light reflective material, and covering at least the first side surface of the first light transparent member and at least the second side surface of the second light transparent member.

6. The light emitting device according to claim 1, wherein the first insulating layer is a distributed Bragg reflector (DBR) comprising a plurality of first dielectric layers and a plurality of second dielectric layers, wherein the refractive index of the first dielectric layers is different from the refractive index of the second dielectric layers.

7. The light emitting device according to claim 1, wherein the first light transparent member comprises quantum dot phosphor and/or non-quantum dot phosphor.

8. The light emitting device according to claim 1, wherein the second light transparent member is formed on the first light transparent member by sintering, spray coating, screen printing, sputtering, or evaporating method.

9. A light emitting device, comprising:
a mount substrate;
at least one light emitting element disposed on the mount substrate in a flip-chip manner,
wherein the light emitting element comprises:
a light-transmitting element substrate;
an n-type semiconductor layer disposed on the light-transmitting element substrate;
a light emitting layer disposed on the n-type semiconductor layer;
a p-type semiconductor layer disposed on the light emitting layer, wherein the light emitting layer and the p-type semiconductor layer expose an area of the n-type semiconductor layer;
a first n-electrode disposed on the area of the n-type semiconductor layer;
a first p-electrode disposed on the p-type semiconductor layer;
a first insulating layer disposed on the n-type semiconductor layer so as to insulate the first n-electrode and the first p-electrode from each other;
a second n-electrode disposed on the first n-electrode and the first insulating layer, wherein the second n-electrode has a first area larger than a first joined face between the n-type semiconductor layer and the first n-electrode so that the second n-electrode is electrically connected to the first n-electrode, wherein the second n-electrode is insulated from the first p-electrode by the first insulating layer; and
a second p-electrode disposed on the first p-electrode and the first insulating layer, wherein the second p-electrode has a second area smaller than a third area of the light emitting layer, wherein the second p-electrode is electrically connected to the first p-electrode, wherein the second n-electrode and the second p-electrode have same size and are electrically connected and fixed to the mount substrate;

a first light transparent member that receives incident light emitted from the at least one light emitting element, wherein the first light transparent member is formed of an inorganic substance and an inorganic phosphor, and the first light transparent member has a top surface and a side surface contiguous to the top surface;

a second light transparent member disposed on the top surface of the first light transparent member, wherein the second light transparent member is only formed of the inorganic substance and contains no the inorganic phosphor, and the second light transparent member has an externally exposed light emission surface and a second side surface contiguous to the light emission surface;

a covering member comprising a light reflective material, and surrounding at least the first side surface of the first light transparent member and the second side surface of the second light transparent member; and at least one gap disposed between the first side surface of the first light transparent member, the second side surface of the second light transparent member and the covering member.

10. The light emitting device according to claim 9, wherein the light emitting element is enclosed by the first light transparent member or the second light transparent member in a plan view from the externally exposed light emission surface side.

11. The light emitting device according to claim 9, wherein the first insulating layer has at least one first opening and at least one second opening, and the second n-electrode is electrically connected to the first n-electrode through the at least one first opening of the first insulating layer, and the second p-electrode is electrically connected to the first p-electrode through the at least one second opening of the first insulating layer.

12. The light emitting device according to claim 5, wherein the first insulating layer is a distributed Bragg reflector (DBR) comprising a plurality of first dielectric layers and a plurality of second dielectric layers, wherein the refractive index of the first dielectric layers is different from the refractive index of the second dielectric layers.

13. The light emitting device according to claim 5, wherein the first light transparent member comprises quantum dot phosphor and/or non-quantum dot phosphor.

14. The light emitting device according to claim 5, wherein the second light transparent member is formed on the first light transparent member by sintering, spray coating, screen printing, sputtering, or evaporating method.

* * * * *